(12) United States Patent
Chen et al.

(10) Patent No.: US 7,781,340 B2
(45) Date of Patent: Aug. 24, 2010

(54) METHOD AND SYSTEM FOR ETCHING HIGH-K DIELECTRIC MATERIALS

(75) Inventors: Lee Chen, Austin, TX (US); Audunn Ludviksson, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 302 days.

(21) Appl. No.: 11/713,617

(22) Filed: Mar. 5, 2007

(65) Prior Publication Data
US 2007/0155181 A1 Jul. 5, 2007

Related U.S. Application Data

(62) Division of application No. 10/670,795, filed on Sep. 26, 2003, now Pat. No. 7,202,169.

(60) Provisional application No. 60/413,907, filed on Sep. 27, 2002, provisional application No. 60/413,778, filed on Sep. 27, 2002, provisional application No. 60/413,893, filed on Sep. 27, 2002.

(51) Int. Cl.
*H01L 21/00* (2006.01)
(52) U.S. Cl. .................. 438/689; 438/722; 438/706
(58) Field of Classification Search .................. 438/689, 438/722, 706
See application file for complete search history.

(56) References Cited

U.S. PATENT DOCUMENTS

| | | | |
|---|---|---|---|
| 2,395,800 A * | 3/1946 | Boese, Jr. et al. ............ | 568/319 |
| 4,780,608 A | 10/1988 | Cross et al. | |
| 4,828,817 A | 5/1989 | Outlaw | |
| 5,271,800 A | 12/1993 | Koontz et al. | |
| 5,431,774 A | 7/1995 | Douglas | |
| 5,883,005 A | 3/1999 | Minton et al. | |
| 5,939,334 A | 8/1999 | Nguyen | |
| 5,993,679 A * | 11/1999 | Koide et al. ................... | 216/74 |

(Continued)

FOREIGN PATENT DOCUMENTS

EP 0 964 439 A1 12/1999

(Continued)

OTHER PUBLICATIONS

Jain, Ajay et al., "Thermal dry-etching of copper using hydrogen peroxide and hexafluoroacetylacetone," Thin Solid Films, Elsevier Science S.A., p. 51-56, (Jun. 28, 1995).

(Continued)

*Primary Examiner*—Laura M Menz

(57) ABSTRACT

A system and a method to remove a layer of high-k dielectric material during the manufacturing of an integrated circuit. In one embodiment of the invention, an etch reactant is employed to form volatile etch products when reacted with high-k layers. Alternately, high-k layers can be anisotropically etched of in accordance with a patterned photoresist or hard mask, where a hyperthermal beam of neutral atoms is used to aid in the reaction of an etch reactant with a high-k layer. Alternately, a hyperthermal beam of neutral atoms or a plasma treatment can used to modify a high-k layer, and subsequently etch the modified high-k layer utilizing an etch reactant that reacts with the modified high-k layer. In still another embodiment of the invention, the hyperthermal beam of neutral atoms is used to etch a high-k layer through physical bombardment of the high-k layer.

23 Claims, 20 Drawing Sheets

U.S. PATENT DOCUMENTS

| | | | |
|---|---|---|---|
| 6,065,481 A * | 5/2000 | Fayfield et al. | 134/1.3 |
| 6,149,828 A | 11/2000 | Vaartstra | |
| 6,159,859 A * | 12/2000 | Robertson et al. | 438/706 |
| 6,211,126 B1 | 4/2001 | Wojtczak et al. | |
| 6,322,714 B1 | 11/2001 | Nallan et al. | |
| 6,331,701 B1 | 12/2001 | Chen et al. | |
| 6,350,689 B1 * | 2/2002 | Ho et al. | 438/687 |
| 6,563,183 B1 | 5/2003 | En et al. | |
| 6,589,329 B1 * | 7/2003 | Baum et al. | 106/287.15 |
| 6,613,695 B2 | 9/2003 | Pomarede et al. | |
| 6,666,986 B1 | 12/2003 | Vaartstra | |
| 6,969,688 B2 * | 11/2005 | Perng et al. | 438/745 |
| 7,049,232 B2 * | 5/2006 | Lee et al. | 438/680 |
| 7,202,169 B2 * | 4/2007 | Chen et al. | 438/689 |
| 7,214,327 B2 * | 5/2007 | Chen et al. | 216/62 |
| 7,383,841 B2 * | 6/2008 | Shinriki et al. | 134/22.1 |
| 2004/0067657 A1 * | 4/2004 | Perng et al. | 438/745 |
| 2004/0110375 A1 * | 6/2004 | Chen et al. | 438/689 |
| 2004/0118812 A1 * | 6/2004 | Watkins et al. | 216/83 |
| 2004/0129674 A1 | 7/2004 | Bease et al. | |
| 2004/0166671 A1 * | 8/2004 | Lee et al. | 438/680 |
| 2005/0139234 A1 * | 6/2005 | Dobashi et al. | 134/19 |
| 2005/0142885 A1 * | 6/2005 | Shinriki | 438/706 |
| 2005/0224456 A1 * | 10/2005 | Chen et al. | 216/58 |
| 2006/0148193 A1 * | 7/2006 | Lee et al. | 438/396 |
| 2006/0175011 A1 * | 8/2006 | Shinriki et al. | 156/345.29 |
| 2007/0042602 A1 * | 2/2007 | Watkins et al. | 438/689 |
| 2007/0134916 A1 * | 6/2007 | Iwabuchi et al. | 438/636 |
| 2007/0155181 A1 * | 7/2007 | Chen et al. | 438/706 |
| 2007/0292603 A1 * | 12/2007 | Dordi et al. | 427/98.1 |
| 2007/0292604 A1 * | 12/2007 | Dordi et al. | 427/99.5 |
| 2007/0292615 A1 * | 12/2007 | Dordi et al. | 427/299 |
| 2009/0179003 A1 * | 7/2009 | Nishimura | 216/41 |

FOREIGN PATENT DOCUMENTS

| | | | |
|---|---|---|---|
| EP | 1 201 603 A2 | | 5/2002 |
| JP | 2000-503805 | | 3/2000 |
| JP | 2001-319923 | | 11/2001 |
| JP | 2004-512682 | | 4/2002 |
| JP | 10-321594 | | 4/2004 |
| JP | 2004-523885 | | 8/2004 |
| WO | WO 97/25740 | * | 7/1997 |
| WO | 02/33739 A1 | | 4/2002 |
| WO | 02/43115 A2 | | 5/2002 |
| WO | WO 2004/109772 A2 | | 12/2004 |

OTHER PUBLICATIONS

Steger, Richard et al., "Chemical vapor etching of copper using oxygen and 1,1,1,5,5,5-hexafluoro-2,4-pentanedione," Thin Solid Films, Elsevier Science S.A., p. 221-229, (Jul. 24, 1999).

Lee, Wonhee et al., "Dry patterning of copper films using an O2 plasma and hexafluoroacetylacetone," Thin Solid Films, Elsevier Science B.V., p. 122-127, (Mar. 12, 2001).

English translation of Japan Official Action mailed May 27, 2008, for U.S. Appl. No. 10/670,795, filed Sep. 26, 2003.

Japan Patent Office, Official Action mailed Sep. 15, 2009, for Japan Patent Application No. 2004-540192, corresponding to U.S. Appl. No. 10/670,795, 4 pages.

* cited by examiner

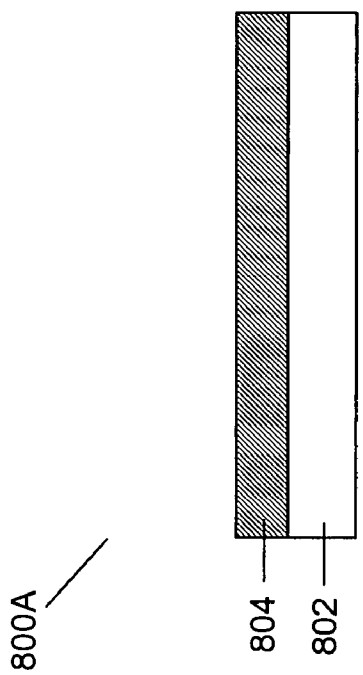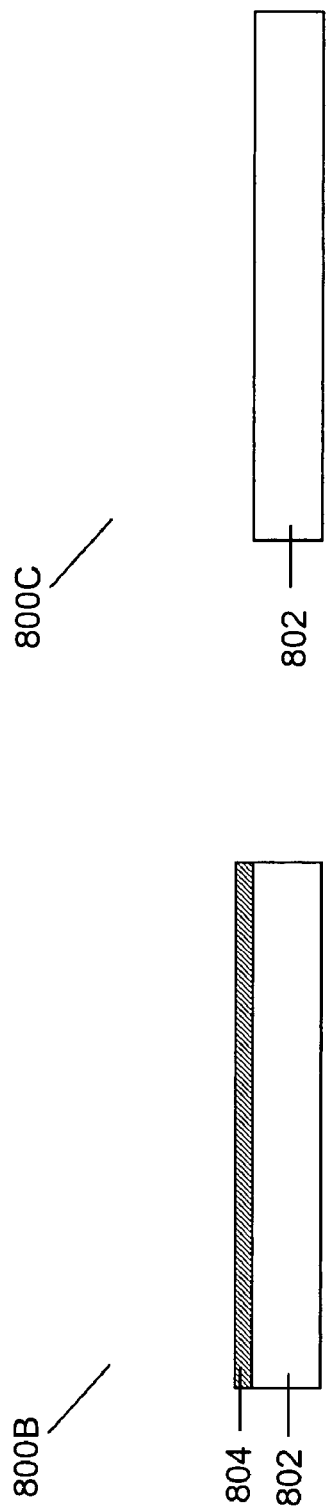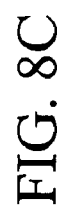

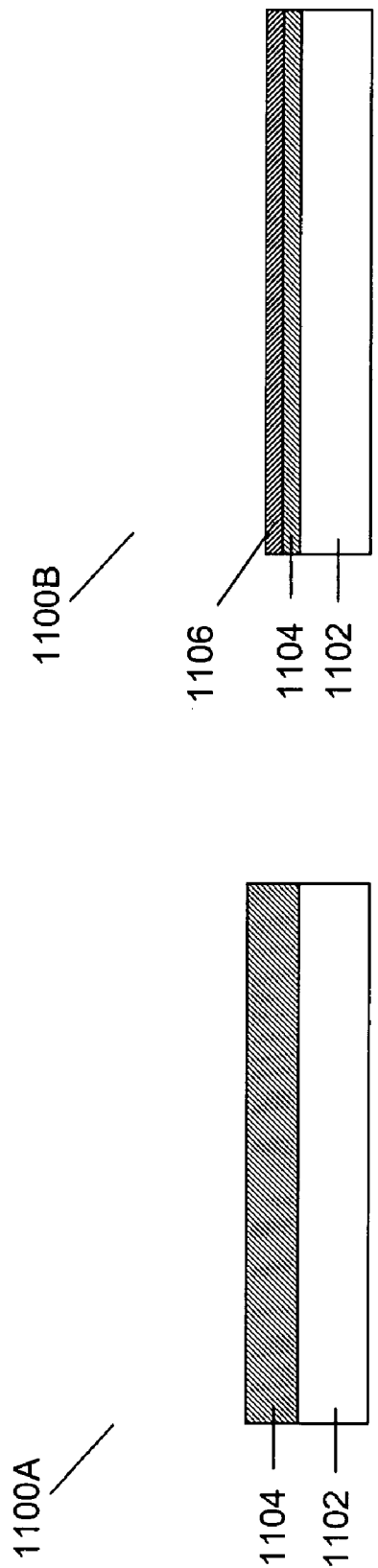
FIG. 11B
FIG. 11A
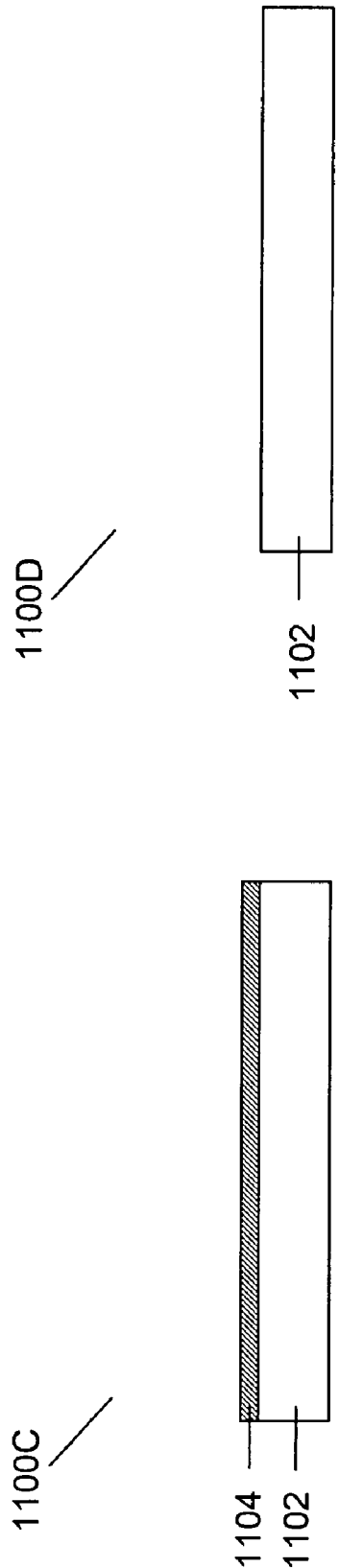
FIG. 11D
FIG. 11C

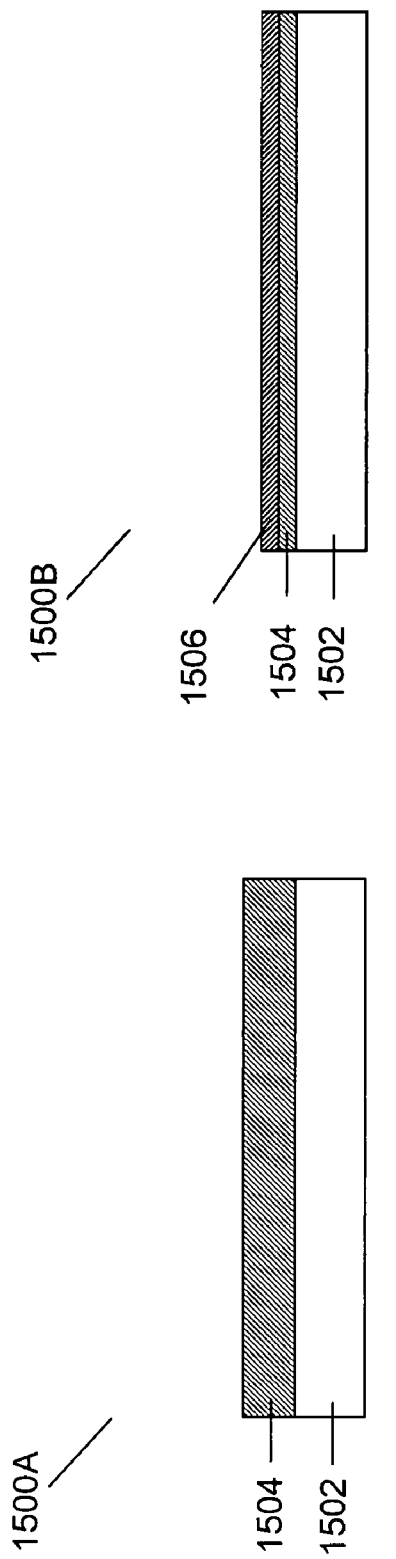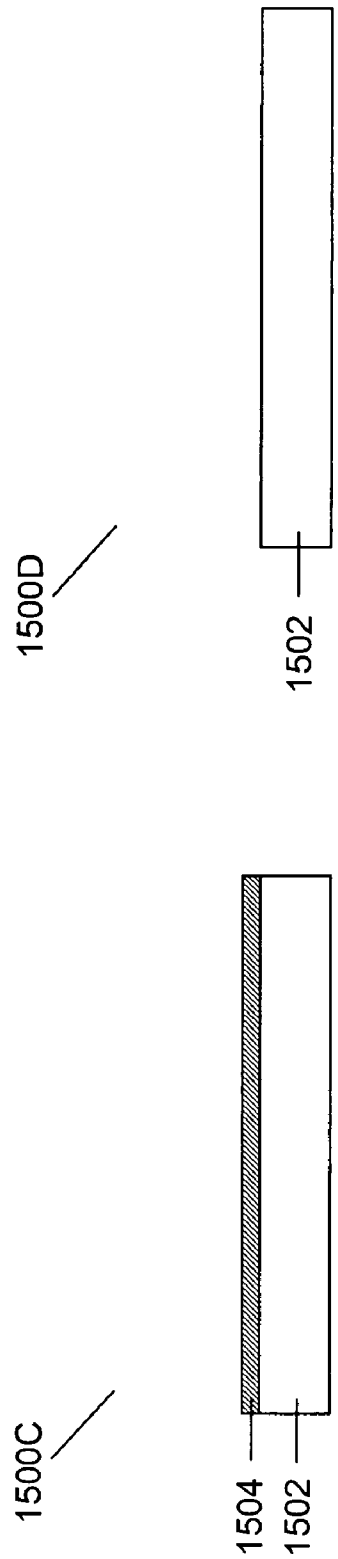
FIG. 15B
FIG. 15D
FIG. 15A
FIG. 15C

METHOD AND SYSTEM FOR ETCHING HIGH-K DIELECTRIC MATERIALS

This application is a divisional of U.S. patent application Ser. No. 10/670,795, filed Sep. 26, 2003, now U.S. Pat. No. 7,202,169, which in turn relies upon U.S. Provisional Patent Applications Nos. 60/413,907, 60/413,778 and 60/413,893, all filed Sep. 27, 2002, the entire contents of all of which are incorporated herein by reference.

FIELD OF THE INVENTION

The present invention relates to the field of semiconductor processing and more particularly to a method and a system for dry etching layers of high-permittivity dielectric materials used in integrated circuits.

BACKGROUND OF THE INVENTION

In the semiconductor industry, the minimum feature sizes of microelectronic devices are approaching the deep sub-micron regime to meet the demand for faster, lower power microprocessors and digital circuits. Process development and integration issues are key challenges for new gate stack materials and silicide processing, with the imminent replacement of $SiO_2$ with high-permittivity dielectric materials (also referred to herein as high-permittivity materials or "high-k" materials), and the use of alternative gate electrode materials to replace doped poly-Si in sub-0.1 μm complementary metal-oxide semiconductor (CMOS) technology.

Dielectric materials featuring a dielectric constant greater than that of $SiO_2$ (k~3.9) are commonly referred to as high-k materials. In addition, high-k materials may refer to dielectric materials that are deposited onto Si substrates rather than grown on the Si surface ($SiO_2$, $SiN_xO_y$). High-k materials used in semiconductor applications typically incorporate metal silicates or metal oxides (e.g., $Ta_2O_5$ (k~26), $TiO_2$ (k~80), $ZrO_2$ (k~25), $Al_2O_3$ (k~9), HfSiO, $HfO_2$ (k~25)). During the manufacturing of semiconductor devices, the high-k layers are frequently etched and removed in order to allow silicidation of the source/drain regions, and to reduce the risk of unwanted metallic impurities being implanted into the source/drain regions during ion implantation.

SUMMARY OF THE INVENTION

The invention provides a method and a system for effectively removing layers of high-k materials from semiconductor substrates. The substrates can, for example, include a liquid crystal display on a liquid crystal display panel, a semiconductor wafer, or a microelectromechanical (MEM) device.

In one embodiment of the invention, an etch reactant is employed that effectively removes high-k layers by thermally reacting with the high-k layers and forming volatile etch products. The etch reactant comprises a β-diketone gas.

In another embodiment of the invention, a method allows for etching of high-k layers by utilizing an etch reactant that forms volatile etch products when reacted with a high-k layer and a hyperthermal beam of neutral atoms that enhances the removal of the etch products from the high-k layer.

In yet another embodiment of the invention, a hyperthermal beam of neutral atoms is used to modify a high-k layer by disrupting and/or reducing the thickness of the high-k layer. The modified high-k layer is subsequently etched utilizing an etch reactant that forms volatile etch products when reacted with the modified high-k layer.

In still another embodiment of the invention, a hyperthermal beam of neutral atoms is used to etch the high-k layers through physical bombardment of the high-k layers.

In another embodiment of the invention, a method utilizes a plasma process to modify a high-k dielectric layer, followed by a non-plasma process that etches the modified layer in the presence of a gaseous etch reactant.

The abovementioned processes can, for example, be implemented as an additional step performed at the end of a gate-electrode etching process, or as an additional step added at the end of a spacer-etch process.

BRIEF DESCRIPTION OF THE DRAWINGS

In the drawings:

FIGS. 8A-8C show an exemplary cross-sectional representation of an etching process for a high-k layer according to another embodiment of the invention;

FIGS. 11A-11D show an exemplary cross-sectional representation of an etching process for a high-k layer according to an alternative embodiment of the invention;

FIGS. 15A-15D show an exemplary cross-sectional representation of an etching process for a high-k layer according to an alternative embodiment of the invention;

DETAILED DESCRIPTION OF SEVERAL EMBODIMENTS

In one embodiment of the invention, a high-k layer is etched by exposing the layer to a process gas comprising a β-diketone etch reactant that readily reacts with the high-k layer to form volatile etch products. The etch reactant reacts with the layer by chelating with metal ions in the layer (i.e., the etch reactant attaches to a metal ion through more than one ligand atom), thereby forming etch products that allow complete (or partial) removal of the exposed high-k layer.

Figure 1B:
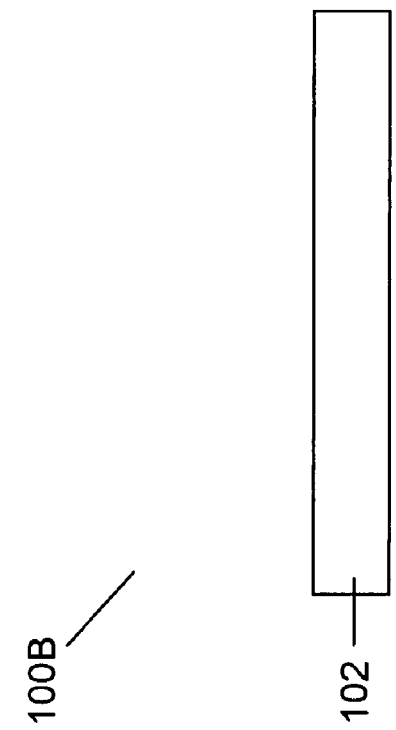
FIGS. 1A-1B show an exemplary cross-sectional representation of an etching process for a high-k layer according to one embodiment of the invention.
Figure 1A:
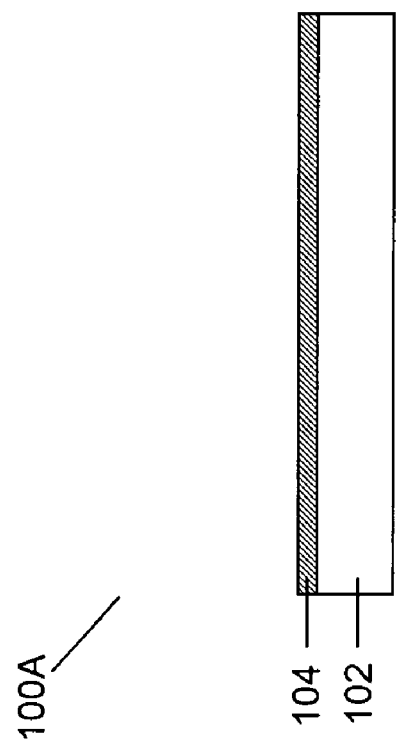

FIGS. 1A-1B show an exemplary cross-sectional representation of an etching process for a high-k layer. In FIGS. 1-3 like reference numbers are used to indicate like elements throughout. In FIG. 1A, the segment 100A comprises a high-k layer 104 overlying a substrate 102 (e.g., Si). Etching of the high-k layer 104 in FIG. 1A results in the structure 100B shown in FIG. 1B, where the high-k layer has been removed by exposing the layer to a process gas comprising a β-diketone etch reactant.

In the manufacturing of semiconductor devices, the etching and removal of a high-k layer can be carried out at different stages during the patterning process. For example, where a gate electrode structure contains a high-k layer, the etching of the high-k layer can be added to the end of a normal gate etch process, or added to a standard spacer-etch process.

For example, a series of plasma steps for forming a gate electrode that is defined by a photoresist or hard mask can comprise: 1) "break-through", that etches through the photoresist or hard mask; 2) "main-etch", that forms the electrode features; and 3) "over-etch", that etches and removes the (high-k) dielectric layer overlying the Si substrate.

The above plasma etch step 3) can be accomplished by an etch process that etches the high-k layer by exposing the layer to a process gas comprising a β-diketone etch reactant that readily reacts with the high-k layers to form volatile etch products. This etch can occur even in the absence of a plasma.

Figure 2B:
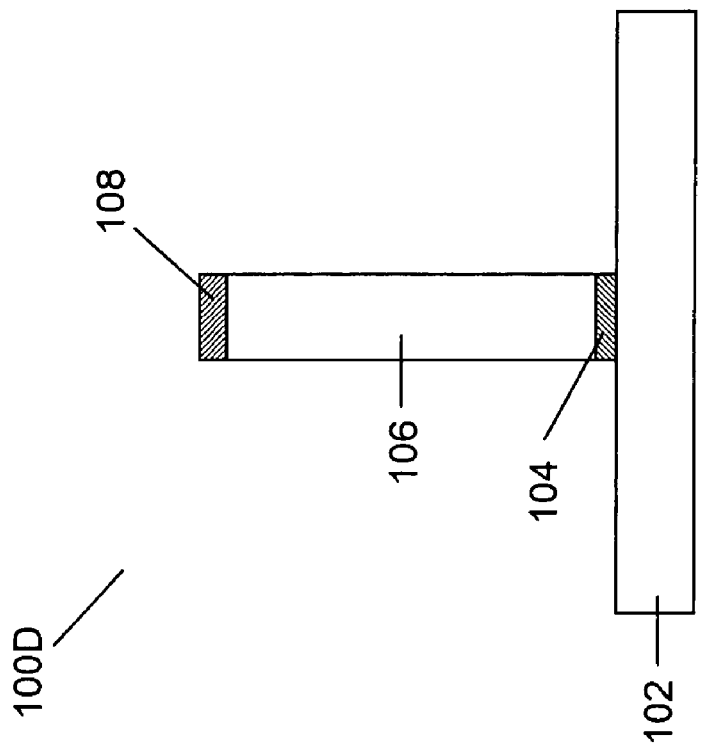
FIGS. 2A-2B show an exemplary cross-sectional representation of an etching process for a high-k layer in a gate electrode structure according to one embodiment of the invention.
Figure 2A:
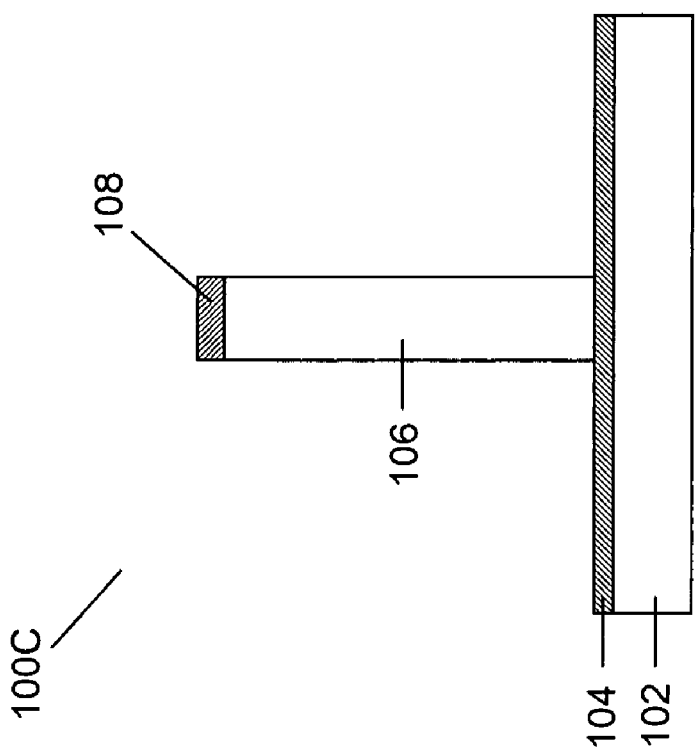

FIGS. 2A-2B show an exemplary cross-sectional representation of an etching process for a high-k layer in a gate electrode structure. FIGS. 2A-2B illustrate how this can be implemented as a step added to the end of a normal gate etch process recipe. FIG. 2A shows a partially completed integrated circuit. The segment 100C comprises a Si substrate 102, a high-k layer 104, a gate electrode 106, and a photoresist or hard mask 108. Examples of a gate electrode 106 include doped poly-Si, and a doped poly-Si layer overlying a SiGe layer. In addition, a very thin layer of $SiO_2$ (not shown) is often present between the Si substrate 102 and the high-k layer 104, to ensure a good channel interface to maximize carrier mobility. Etching of the high-k layer in FIG. 2A results in the structure 100D shown in FIG. 2B where the uncovered part of the high-k layer in FIG. 2A has been removed by exposing the high-k layer to a β-diketone etch reactant.

Alternatively, the removal of the high-k layer can be carried out at the end of a spacer etch process. Sidewall spacers are commonly used to achieve isolation between the gate and source/drain regions, as well as to facilitate fabrication of self-aligned, drain-engineered dopant structures. Sometimes, it is desirable to have the high-k layer remaining on the source/drain region while performing the spacer-etch process, so that the plasma environment is exposed to the "sacrificial" high-k layer instead of the Si. After the spacer is formed, etching and removal of the high-k layer is carried out.

Figure 3A:
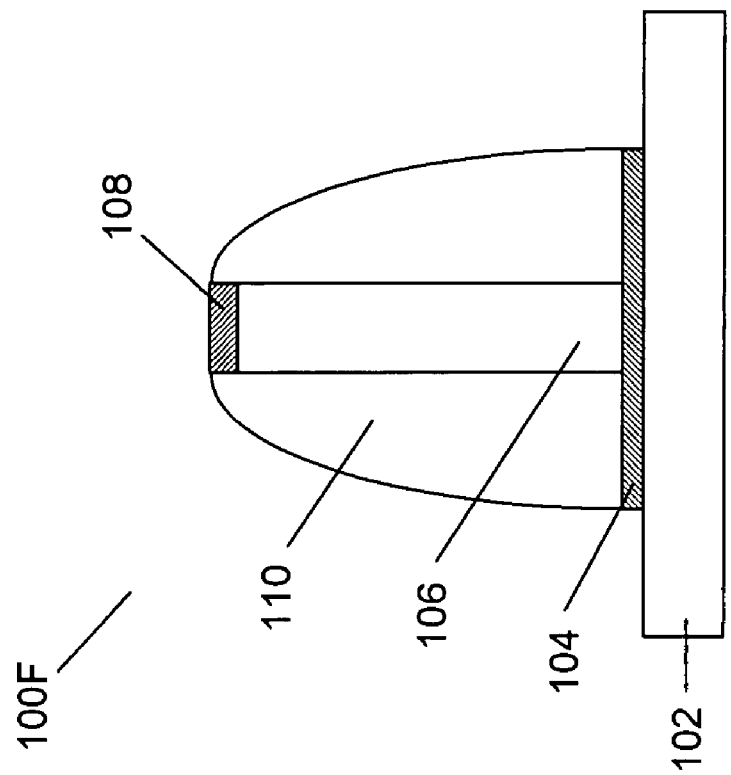
FIGS. 3A-3B show an exemplary cross-sectional representation of an etching process for a high-k layer in a gate electrode structure according to one embodiment of the invention.
Figure 3B:
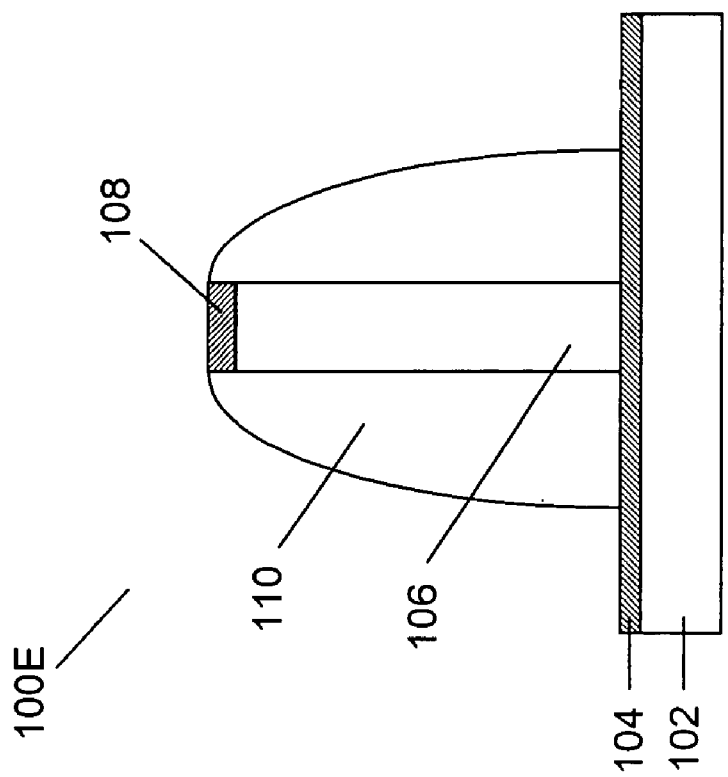

FIGS. 3A-3B show an exemplary cross-sectional representation of an etching process for a high-k layer in a gate electrode structure. FIGS. 3A-3B illustrate how this can be implemented as a step added to a standard spacer-etch process. The segment 100E in FIG. 3A further comprises a sidewall spacer 110. For example, the spacer can be an oxide deposited from tetraethoxysilane (TEOS). Etching of the high-k layer in FIG. 3A results in the structure 100F shown in FIG. 3B where the uncovered part of the high-k layer in FIG. 3A has been removed by exposing the high-k layer to a β-diketone etch reactant.

Figure 4:
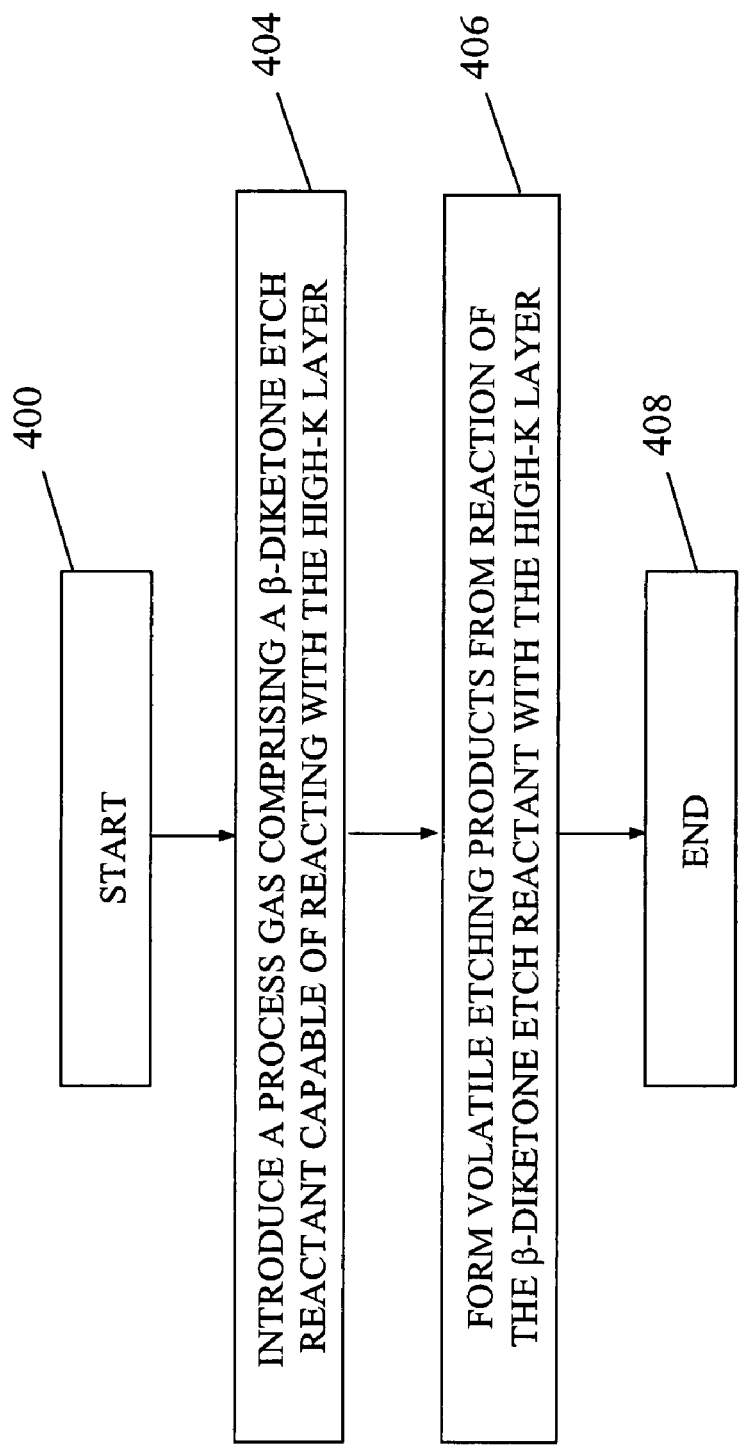
FIG. 4 is a flowchart for etching a high-k layer according to one embodiment of the invention.

FIG. 4 shows a flowchart for etching a high-k layer. At 400, the process is started. At 404, a process gas comprising a β-diketone etch reactant is introduced into the process chamber. At 406, the high-k layer in the chamber is etched by forming volatile etch products from the reaction of the β-diketone etch reactant with the high-k layer. The high-k layer is exposed to the etch reactant for a time period that enables desired etching of the high-k layer, and the process ends at 408.

The β-diketone etch reactants that are employed to etch high-k layers, are characterized by a molecular structure involving two carbonyl (C—O) functional groups that are separated by a single carbon atom to which at least one hydrogen atom is attached. β-diketones are also characterized by keto-enol tautomerism, where tautomerism refers to an equilibrium between different structures of the same compound.

Figure 5:
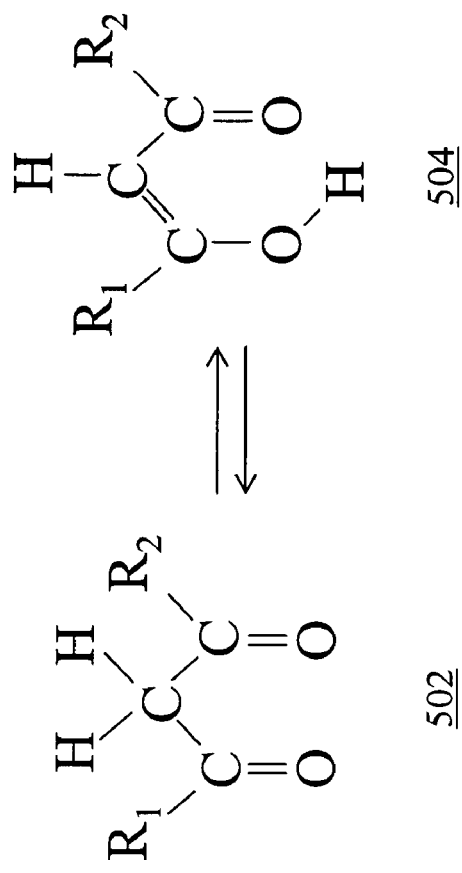
FIG. 5 schematically illustrates keto-enol tautomerism for β-diketone etch reactants.

FIG. 5 schematically illustrates keto-enol tautomerism for β-diketones. The enol form 504 is stabilized with respect to the keto form 502 by the presence of conjugated double bonds (conjugation is a bonding arrangement that consists of two double chemical bonds separated by one single chemical bond). Keto-enol tautomerism results in β-diketones having chemical properties of both ketones and enols, and for β-diketones, the possibility of intramolecular H-bonding can make enol formation much more favorable than in compounds that contain only one ketone group. In the chemical equilibrium shown in FIG. 5, the net reaction in the formation of the enol is migration of a hydrogen from carbon to oxygen. Especially movable are the hydrogen atoms, which are next to a carbon atom bound with two carbonyl groups ($R_1$—CO—$CH_2$—CO—$R_2$), and the possibility to form other stable structure (enol), which resembles a six-atom ring($R_1$—CO—CH=CO—$R_2$), stabilizes that form.

In addition, the conjugated nature of the double bonding implies significant delocalization of β-electrons, which affects the ability to bond to metal atoms. These delocalized electrons readily interact with the d-electrons of metals to form coordination compounds. Due to the presence of the two carbonyl groups, each β-diketonate ligand can coordinate twice with the metal atom to form a closed ring or chelated structure.

Figure 6:
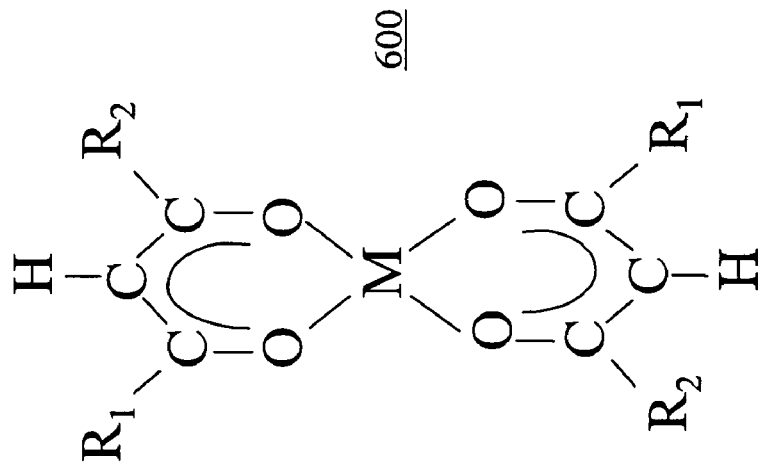
FIG. 6 shows a schematic illustration of a $M(hfac)_2$ etch product.

FIG. 6 shows a schematic illustration of a $M(hfac)_2$ etch product. The $M(hfac)_2$ etch product 600 can be formed from the reaction of a β-diketone with a metal cation M in an oxidized metal layer. An important property of β-diketones is that they readily form stable anions that can react with metal cations to form stable complexes that have relatively high volatility. For example, $Cu(hfac)_2$ and Cu(hfac)VTMS precursors compounds are used for chemical vapor deposition (CVD) of Cu layers.

Metal oxides (e.g., high-k metal oxides) and oxidized metal layers (e.g., oxidized Cu layers) can react with β-diketones to form volatile etch products. For example, in the etching of oxidized Cu layers using hfacH (1,1,1,5,5,5-hexafluoro-acetylacetone), the etching reaction can form Cu(hfac)$_2$ and H$_2$O etch products that are volatile at low temperatures (P$_{vap}$(Cu(hfac)$_2$)=0.1 Torr @ 50° C.), and the etch products do not significantly redeposit on sidewalls of etch features or on the process chamber walls. Analogously, in the etching of high-k metal oxides, volatile etch products are formed that allow efficient etching of the high-k layers.

Common β-diketones include acetylacetone (acacH, where R$_1$=R$_2$=CH$_3$); 1,1,1-trifluoro-acetylacetone (tfacH, where R$_1$=CF$_3$ and R$_2$=CH$_3$); and the abovementioned hfacH (where R$_1$=R$_2$=CF$_3$). These compounds are commercially available and are widely used in chemical synthesis.

HfacH has the highest vapor pressure (85 Torr at 20° C.) of the abovementioned β-diketones, and this allows for easy transport of the gaseous hfacH etching gas to the processing chamber using a delivery system that can comprise a bubbler system and a mass flow controller (MFC). The bubbler system can be used with or without a carrier gas such as an inert gas (e.g., Ar, He, and N$_2$). When a carrier gas is used, it is bubbled through the hfacH liquid and becomes saturated with the hfacH vapor. The partial pressure of the hfacH vapor in the process chamber is controlled by the temperature of the hfacH liquid in the bubbler. Exemplary gas flow rates for an etch reactant-containing carrier gas can be less than 1000 sccm. Alternatively, a liquid injection system can be used to deliver the etch reactant to the process chamber. In the case of etch reactants in solid form, a carrier gas can be passed over the solid and the gas mixture introduced into the process chamber.

An inert gas can be added to any one of the aforementioned process gas chemistries. The inert gas may include at least one of Ar, He, Ne, Kr, Xe, and N$_2$. For example, the addition of inert gas to the process chemistry is used to dilute the process gas or adjust the process gas partial pressure(s).

In addition, an oxygen-containing gas (e.g., O$_2$, H$_2$O, H$_2$O$_2$) can be added to any one of the aforementioned process gas chemistries. The role of the oxygen-containing gas in the etch process can be to fill any oxygen vacancies on the surface of the high-k layer that can affect the etch rate of the high-k material, or to chemically modify the etch reactant. The modification can involve interaction of the oxygen-containing gas with the etch reactant in the gas phase or on the etch surface.

Process conditions that enable the desired etching of the high-k layer may be determined by direct experimentation and/or design of experiments (DOE). For example, adjustable process parameters can comprise time, temperature (i.e., substrate temperature), process pressure, process gases and relative gas flows of the process gases. The process parameter space for the dry etch process can, for example, utilize a chamber pressure less than 10 Torr, a process gas flow rate less than 2000 sccm, an etch reactant gas flow rate less than 1000 sccm (including a carrier gas), and a substrate temperature less than 400° C., or alternately, less than 200° C.

Figure 7:
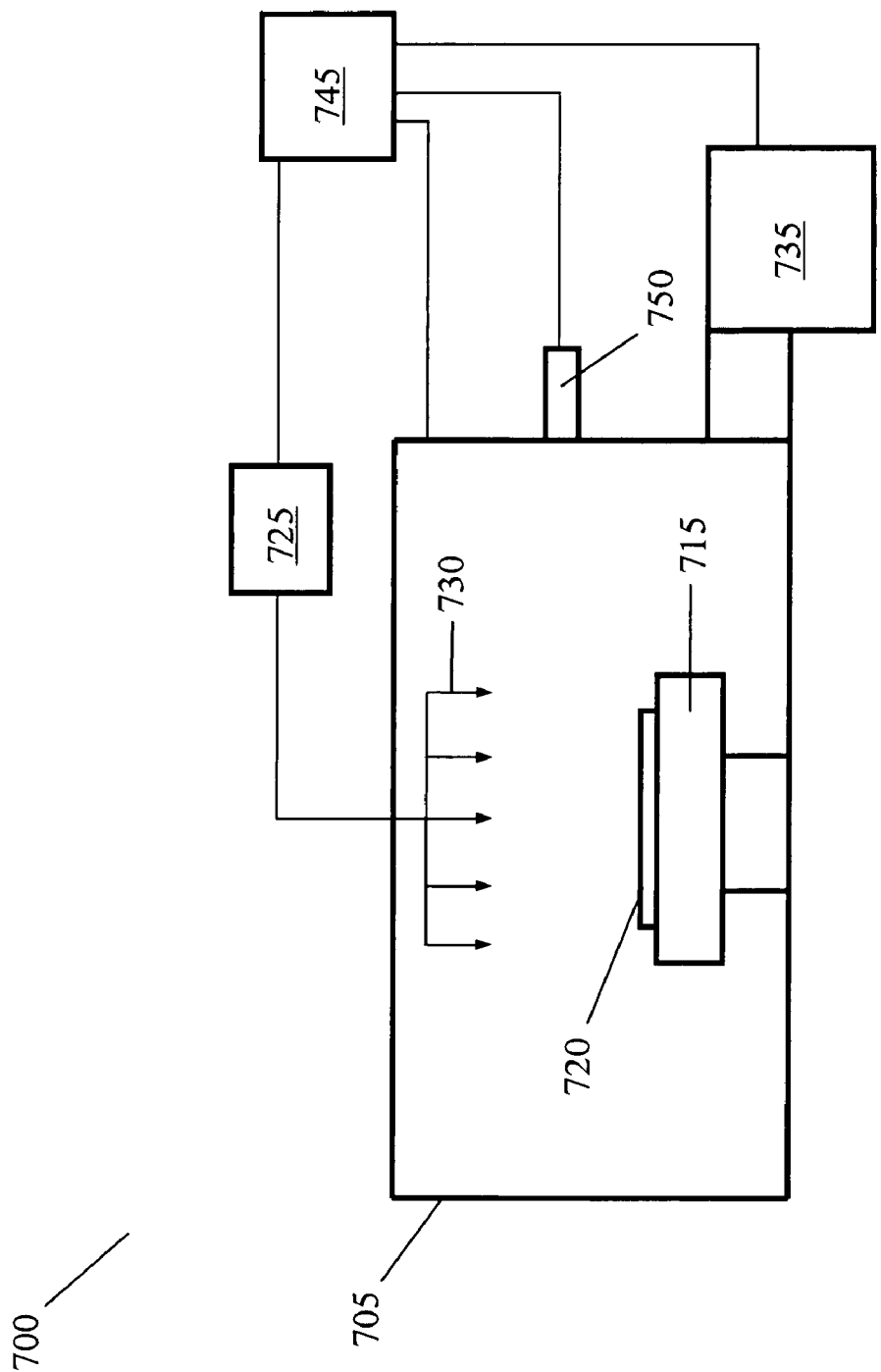
FIG. 7 shows a processing system according to one embodiment of the present invention.

FIG. 7 shows a processing system 700 comprising a process chamber 705. The process chamber 705 comprises a substrate holder 715, upon which a substrate 720 to be processed is affixed, a gas injection system 725 for introducing process gas 730 to the process chamber 705, and a vacuum pumping system 735. For example, a gate valve (not shown) is used to throttle the vacuum pumping system 735. Process gas 730 is introduced via the gas injection system 725 and the process pressure is adjusted. The gas injection system 725 allows independent control over the delivery of process gas 730 to the process chamber from ex-situ gas sources. The gas injection system 725 can employ an effusive gas distribution source such as a showerhead. The process gas 730 can comprise the etch reactant and other gases.

Substrate 720 is transferred into and out of process chamber 705 through a slot valve (not shown) and chamber feed-through (not shown) via robotic substrate transfer system where it is received by substrate lift pins (not shown) housed within substrate holder 715 and mechanically translated by devices housed therein. Once the substrate 720 is received from the substrate transfer system, it is lowered to an upper surface of the substrate holder 715.

In an alternate embodiment, the substrate 720 is affixed to the substrate holder 715 via an electrostatic clamp (not shown). Furthermore, the substrate holder 715 further includes a temperature adjustment system including a re-circulating coolant flow that receives heat from the substrate holder 715 and transfers heat to a heat exchanger system (not shown), or when heating, transfers heat from the heat exchanger system. Moreover, gas may be delivered to the backside of the substrate to improve the gas-gap thermal conductance between the substrate 720 and the substrate holder 715. Such a system is utilized when temperature control of the substrate is required at elevated or reduced temperatures. Vacuum pump system 735 can include a turbo-molecular vacuum pump (TMP) capable of a pumping speed up to 5000 liters per second (and greater) and a gate valve for throttling the chamber pressure.

A controller 745 includes a microprocessor, a memory, and a digital I/O port capable of generating control voltages sufficient to communicate and activate inputs to the processing system 700 as well as monitor outputs from the processing system 700. Moreover, the controller 745 is coupled to and exchanges information with the process chamber 705, the process monitor system 750, the gas injection system 725 and the vacuum pump system 735. A program stored in the memory is utilized to control the aforementioned components of a processing system 700 according to a stored process recipe. One example of controller 745 is a digital signal processor (DSP), model number TMS320, available from Texas Instruments, Dallas, Tex.

The process monitor system 750 can comprise, for example, a mass spectrometer system to measure gaseous species, such as etch reactants, etch by-products, and other gases in the processing environment. In general, the process monitor system 750 is a versatile diagnostic tool capable of performing multiple tasks such as process analysis and end-point detection. The process monitor system 750 in FIG. 7 is attached to the processing chamber 705. In an alternate embodiment, some process monitor system components can be located downstream from the vacuum pump system 735. The process monitor system 750 can be used with controller 745 to determine the status of the etching process and provide feedback to ensure process compliance.

The high-k layer is exposed to the etch reactants for a time period that results in the desired etching of the high-k layer. When the high-k layer has been etched (down to the Si layer), the etching process is stopped. An overetch step may be utilized to further assure complete removal of the high-k layer. The actual amount of overetch needed to assure complete removal of the high-k layer, can be determined empirically by examining a series of substrates that are overetched to different degrees. These substrates can furthermore be used to evaluate the effect of the etch process on the underlying Si (or SiO$_2$) layer.

Alternatively, removal of the high-k layer can be determined using endpoint detection. One possible method of endpoint detection is to monitor a portion of a spectrum from the processing region that indicates when all (or substantially all) of the high-k layer has been removed from the substrate. For example, portions of the spectrum that indicate such a removal can be measured using Mass Spectroscopy (MS). After mass signal levels corresponding to etch products and/or etch reactants cross or reach a specified threshold (e.g., drop to substantially zero or increase above a particular level), the etch process can be considered to be complete.

FIGS. 8A-8C show an exemplary cross-sectional representation of etching a high-k layer according to another embodiment of the invention. In FIG. 8A, the segment 800A comprises a high-k layer 804 overlying a semiconductor substrate 802 (e.g., Si). Removal of the high-k layer 804 in FIG. 8A is carried out by exposing the high-k layer to a process gas comprising an etch reactant, that reacts with the layers to form volatile etch products, and a hyperthermal beam of neutral atoms that enhances the removal of the etch products from the high-k layer through bombardment of the layer. In FIG. 8B, segment 800B illustrates a partial removal of the high-k layer 804. In FIG. 8C, segment 800C shows the complete removal of the high-k layer 804 from the substrate 802.

In a patterned etch process, where fine features are defined by a photoresist or a hard mask, the removal of a high-k layer is substantially anisotropic due to the atom bombardment that is parallel to the surface normal. The process gas and process conditions can be selected such that the patterned features and other materials are not significantly etched or damaged.

In the manufacturing of semiconductor devices, the removal of the high-k layer can be carried out at different stages during the patterning process. For example, the removal can be added to the end of a normal gate etch process recipe, or added to a standard spacer-etch process.

For example, a sequence for forming a gate electrode that is defined by a hard mask can comprise: 1) "break-through", that etches. through the hard mask; 2) "main-etch", that forms the electrode features; and 3) "over-etch", that etches and removes the (high-k) dielectric layer overlying the Si substrate.

The above plasma etch step 3) that removes the high-k layer, can be accomplished by a process that utilizes an etch reactant and hyperthermal beam of neutral atoms.

Referring back to FIG. 2A, etching of the high-k layer according to an embodiment of the invention, results in the structure 100E shown in FIG. 2B, where the uncovered part of the high-k layer in FIG. 2A has been removed by exposing the high-k layer to an etch reactant and hyperthermal beam of neutral atoms. Referring back to FIG. 3A, complete removal of the high-k layer results in the structure 100G shown in FIG. 3B, where the uncovered part of the high-k layer has been removed by exposing the high-k layer to an etch reactant and hyperthermal beam of neutral atoms.

Figure 9:
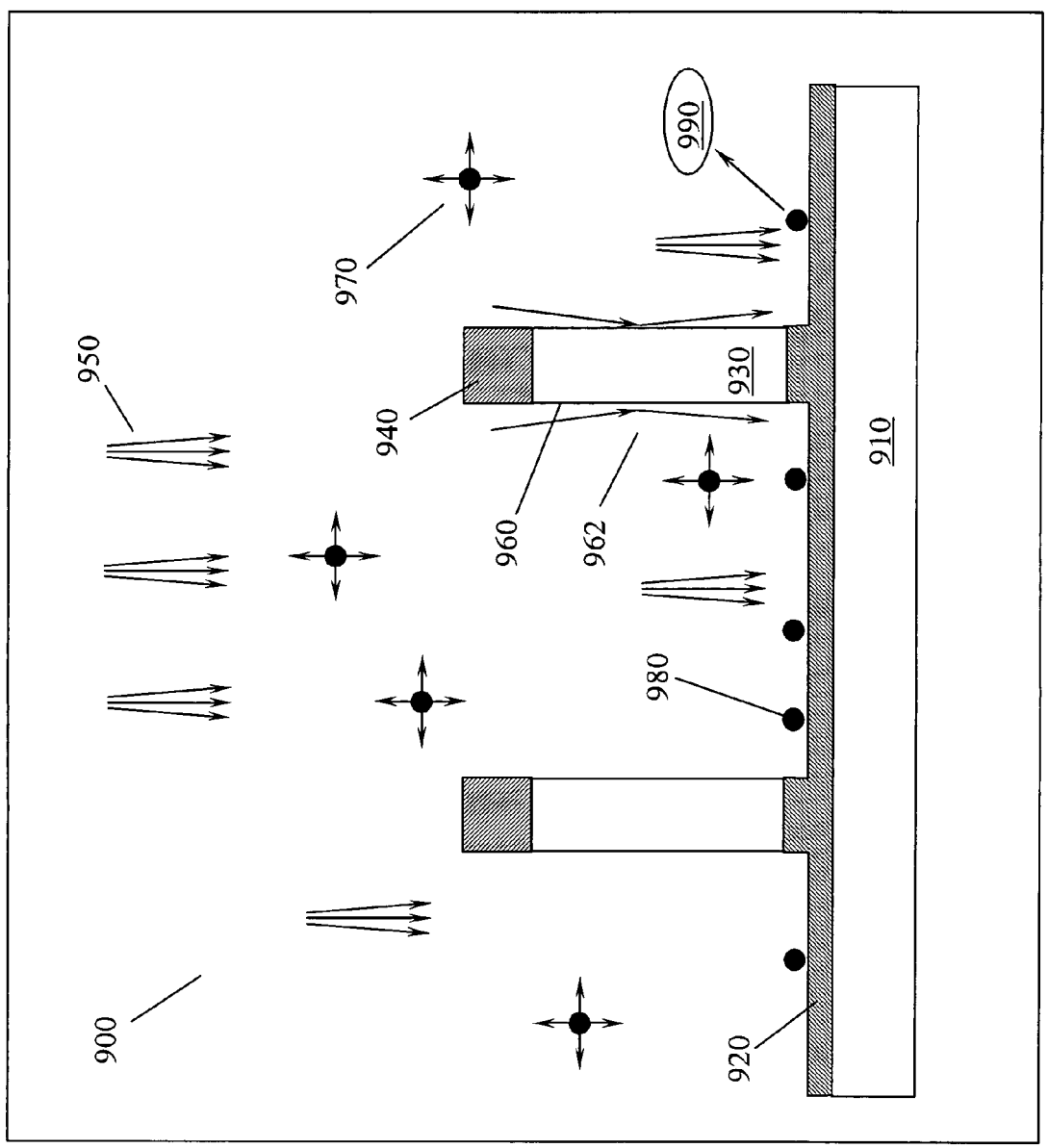
FIG. 9 shows a schematic cross-sectional representation of an anisotropic etching process for a high-k layer.

FIG. 9 shows a schematic cross-sectional representation of anisotropic etching of a high-k layer. The segment 900 shows a partially completed structure that comprises a high-k layer 920 overlaying a Si substrate 910, gate electrode 930, and a photoresist or hard mask pattern 940 overlying the gate electrode 930. Anisotropic etching of the structure in FIG. 9 removes exposed parts of the high-k layer 920 that are normal to the substrate, while preserving the vertical geometry of the structure defined by the patterned layer 940.

For example, the neutral atoms in the hyperthermal beam can be schematically represented by arrows 950 in FIG. 9. A hyperthermal beam of atoms that has a low divergence from the substrate normal is depicted using near vertical arrows 950. The directionality and high kinetic energy of the atoms in the beam result in elastic forward scattering of the atoms (depicted by arrows 962) from the vertical surfaces (sidewalls) of the gate electrode material 930, where the kinetic energy of the hyperthermal atoms in the direction normal to the vertical surfaces is insufficient to result in significant removal of high-k material from the vertical surfaces 960.

A process gas comprising an etch reagent 970 is introduced into the etching chamber separate from the hyperthermal atom beam source using effusive nozzles. The etch reactant 970 can comprise a β-diketone. Exposure of the high-k layer 920 to the etch reactant 970 forms a layer 980 of adsorbed etch reactant. The high-k layer 920 is under constant energetic atom bombardment 950, that aids and enhances the desorption of etch products 990 from the surface and results in etching of the high-k layer 920.

Figure 10:
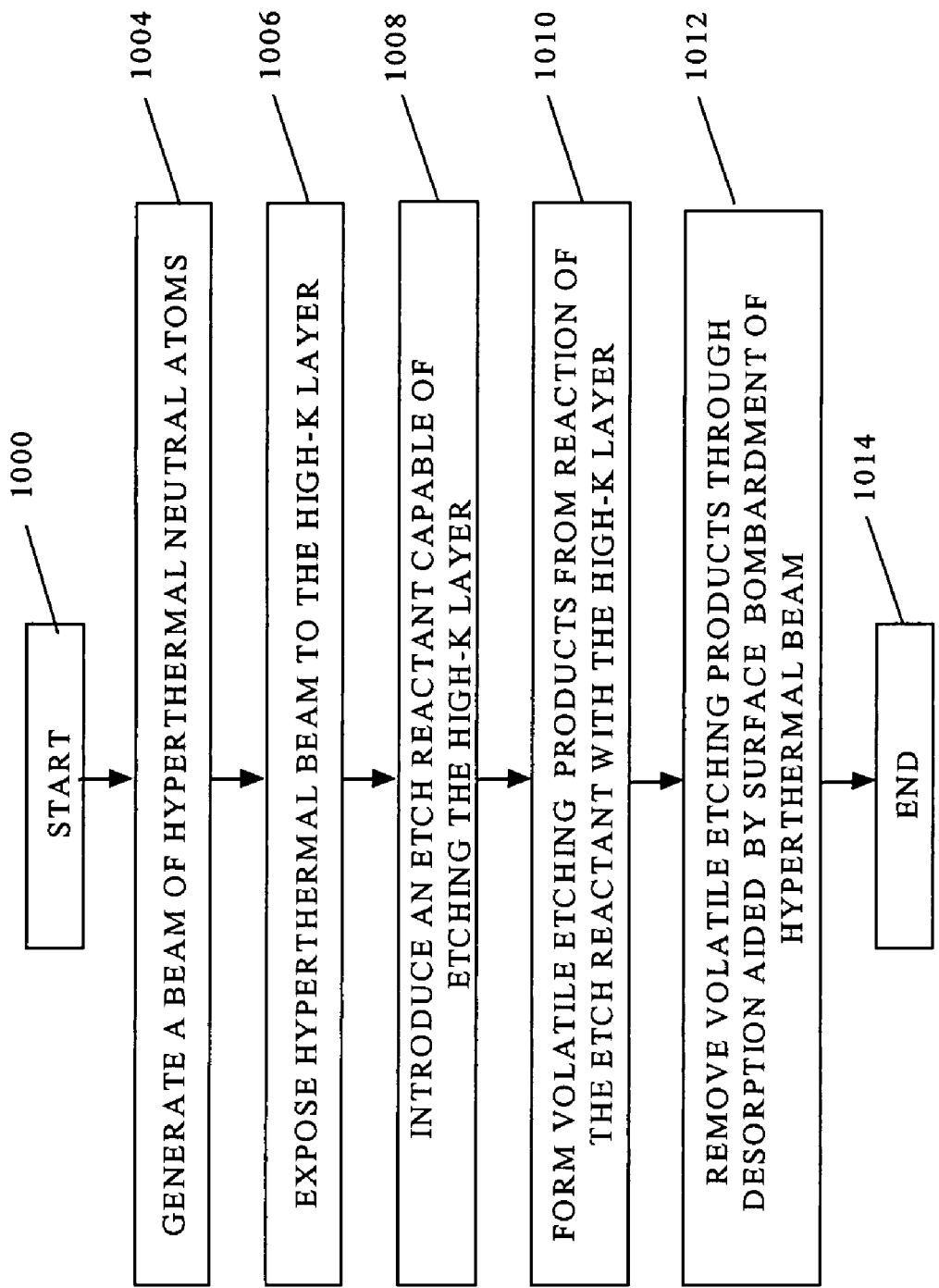
FIG. 10 is a flowchart for etching a high-k layer according to one embodiment of the invention.

FIG. 10 is a flowchart for etching a high-k layer. In FIG. 10, the process is started at 1000. At 1004, a beam of hyperthermal atoms is generated, and the beam of charge neutral atoms is exposed to a high-k layer in a process chamber at 1006. An etching reagent capable of reacting with the high-k layer is introduced into the process chamber at 1008. The etch reactant can comprise a β-diketone. Volatile etching products are formed from the reaction of high-k layers with the etch reactant at 1010 and are removed from the high-k layer at 1012. Desorption of the etching products from the high-k layer is aided by surface bombardment by the energetic neutral atoms in the hyperthermal beam. At 1014, the process ends.

FIGS. 11A-11D show an exemplary cross-sectional representation of etching a high-k layer according an alternate embodiment of the invention. In FIG. 11A, the segment 1100A comprises a high-k layer 1104 overlying a semiconductor substrate 1102 (e.g., Si). Surface modification of the high-k layer 1104 in FIG. 11A is carried out by exposing the high-k layer 1104 to a hyperthermal beam of neutral atoms, thereby forming a modified high-k layer 1106 shown in segment 1100B in FIG. 11B. Following the beam exposure, the modified high-k layer 1106 can be substantially removed by a thermal etch process that exposes the modified layer 1106 to a process gas comprising etch reactants. The etch reactants form volatile etch products when reacted with the modified high-k layer 1106. In segment 1100C (FIG. 11C), the modified layer 1106 has been removed by the etch process. If further removal (thinning) of the high-k layer 1104 is required, the process can be repeated until the desired thickness (or complete removal) of the high-k layer 1104 is achieved. Segment 1100D (FIG. 11D) shows complete removal of the high-k layer 1104.

In the case of very thin high-k layers (e.g., 50Å or thinner), the beam exposure can substantially modify the entire thickness of the high-k layer, and subsequently, a single etch step can achieve complete removal of the high-k layer. For thicker high-k layers, a transitional region can exist between the modified high-k layer 1106 and the substantially unmodified layer 1104.

Figure 12:
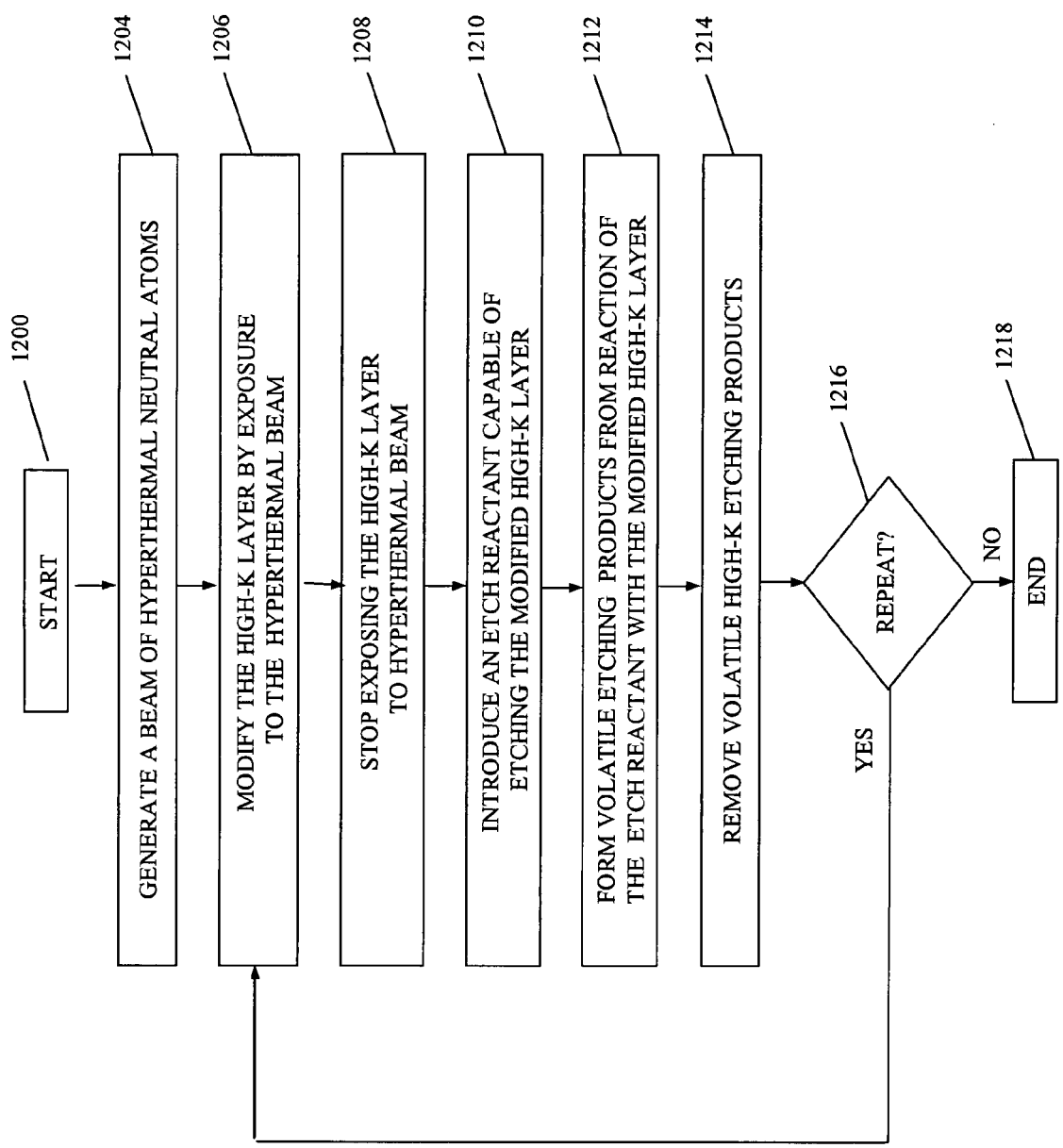
FIG. 12 is a flowchart for etching a high-k layer according to the alternate embodiment of the invention.

FIG. 12 is a flowchart for etching a high-k layer in accordance with an alternate embodiment of the present invention. FIG. 12 illustrates a method of modifying a layer of high-k material by exposing it to a hyperthermal beam of neutral atoms, and subsequently exposing the modified high-k layer to an etch reactant that is capable of etching the layer. In FIG. 12, the process is started at 1200. A substrate can be positioned in a process chamber. At 1204, a hyperthermal beam of neutral atoms, capable of modifying the high-k layer is generated. At 1206, the layer of high-k material is modified by exposure to the beam. When the process at 1206 has been carried out for the desired amount of time to modify the high-k layer, the exposure is stopped at 1208. At 1210, an etch reactant, that is capable of etching the modified high-k layer, is introduced into the process chamber. The etch reactant can comprise a β-diketone. At 1212, volatile reaction products are formed from the reaction of the etch reactant with the modified high-k layer, and the volatile reaction products are removed from the layer at 1214, resulting in removal of the high-k material. This process can be repeated as necessary to obtain the desired etching of the high-k layer at 1216. The process ends at 1218.

Thus, a high-k layer can be etched by exposing the layer to a process gas comprising an etch reactant that readily reacts to form volatile etch products. The etch reactant can comprise a chemical compound, such as a β-diketone, that can react with the layer by chelating with the metal ions in the layer (i.e., attach to a metal ion through more than one ligand atom), thereby forming etch products that allow complete (or partial) removal of the exposed layer. This reaction can result in relatively high etch rates for high-k layers and relatively slow etch rates for surrounding layers. Importantly, Si and $SiO_2$ layers are not known to form volatile etch products when reacted with etch reactants, such as β-diketones, thereby providing desired etch selectivity. An inert gas can be added to any one of the aforementioned process gas chemistries. The inert gas may include at least one of Ar, He, Ne, Kr, Xe, and $N_2$. In addition, an oxygen-containing gas (e.g., $O_2$, $H_2O$, $H_2O_2$) can be added to any one of the aforementioned process gas chemistries.

The exact effect of the exposure of the high-k layer to the hyperthermal beam of neutral atoms is currently not known. It is likely that the exposure to the beam increases the amorphous content of the high-k layer and possibly breaks chemical bonds that create atomic fragments in the high-k layer. In addition to inert gases, the hyperthermal beam can contain atoms such as N and O, where the ion energy is adequate to disrupt the atomic structure of the high-k layer in such a way that the subsequent etching reagent is able to etch the modified high-k layer.

Figure 13:
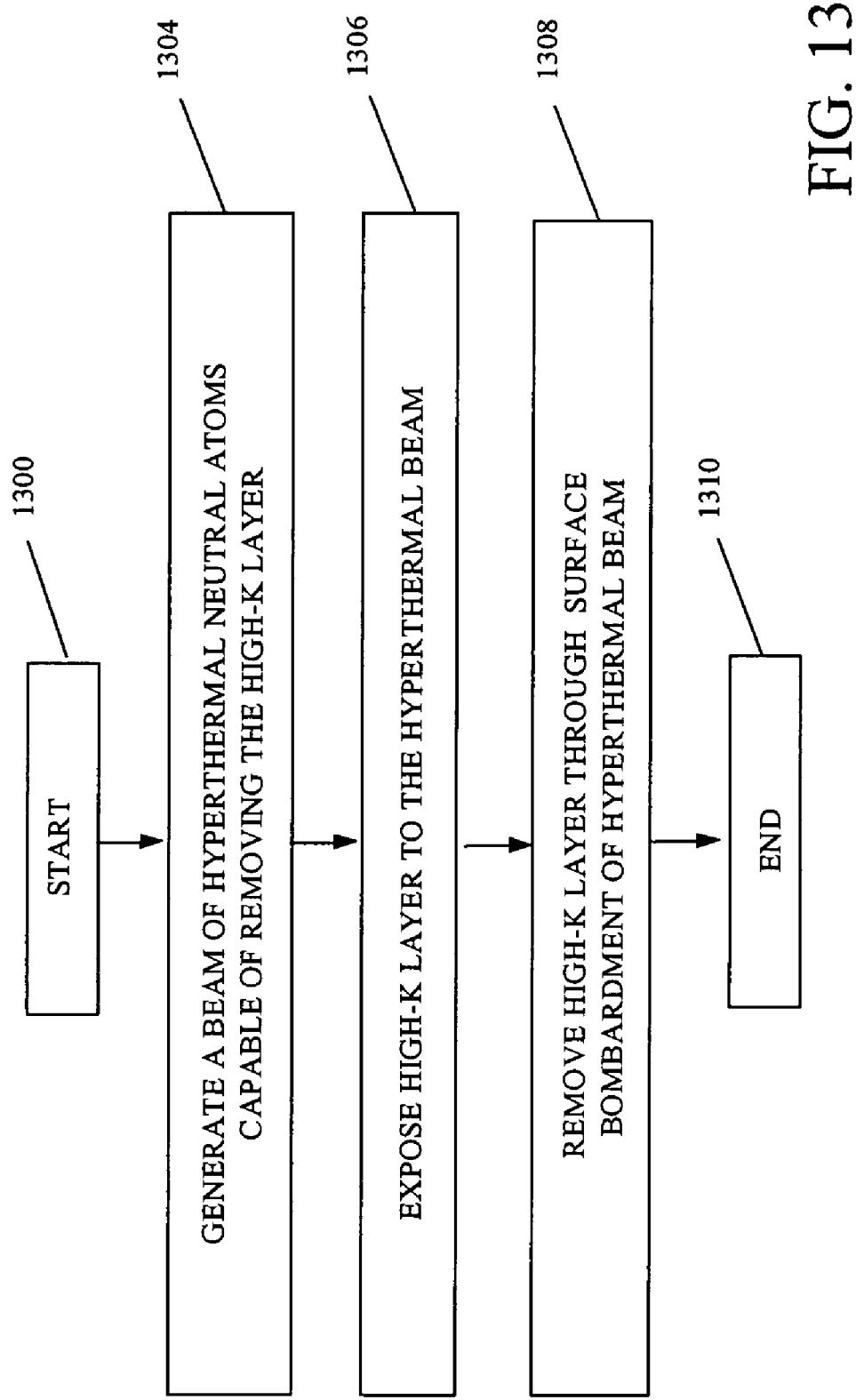
FIG. 13 is a flowchart for etching a high-k layer according to the alternate embodiment of the invention.

FIG. 13 is a flowchart for etching a high-k layer in accordance with an alternate embodiment of the present invention. FIG. 13 illustrates a method of removing a layer of high-k material by exposing it to a hyperthermal beam of neutral atoms that is capable of etching the layer by bombarding (sputtering) the layer. In FIG. 13, the process is started at 1300. A layer is provided having a high-k material overlying a substrate, and the substrate is positioned in a process chamber. At 1304, a beam of hyperthermal neutral atoms is generated, that is capable of removing a high-k layer through physical sputtering of the layer. The beam is exposed to the high-k layer at 1306. The high-k layer is removed at 1308, through surface bombardment of the hyperthermal beam. The process ends at 1310.

The high-k layer is exposed to the hyperthermal beam for a time period that results in the desired etching of the high-k layer. When the high-k layer has been etched (down to the Si layer), the etching process is stopped, and the Si source/drain can be recessed using a plasma process for subsequent epitaxial growth of Si.

It is desirable that the sputtering rates of the high-k layer and the underlying Si substrate be similar. This can be achieved by selecting a gas for the hyperthermal beam that provides a good mass match to high-k layer and the Si substrate (e.g., a heavy gas such as Xe). Alternatively, a gas such as oxygen can be used in the hyperthermal beam to suppress the sputtering rate of Si through the formation of a $SiO_2$ surface layer. The kinetic energy of the hyperthermal beam is selected to allow efficient physical sputtering of the high-k layer.

Process conditions that enable the desired etching of the high-k layer in the above embodiments may be determined by direct experimentation and/or design of experiments (DOE). For example, adjustable process parameters can comprise the choice of atoms and the kinetic energy of the atoms in the hyperthermal beam, substrate temperature, process pressure, choice of etch reactants and relative gas flows.

The hyperthermal beam can comprise inert gases such as noble gases or alternate gases such as oxygen or nitrogen. The high-k layer is exposed to the etch reactant and the beam of energetic neutral atoms and the etch reactant for a time period that enables desired etching of the high-k layer. The kinetic energy of the hyperthermal beam can be chosen so as to remove the etching products from the surface while minimizing physical sputtering of the high-k film by the neutral atoms.

In general, hyperthermal atomic beams contain neutral atoms that have high kinetic energy ($E_k \geq 1$ eV) compared to thermalized atoms ($E_k \sim 0.05$ eV) produced by conventional glow discharge devices, such as plasma ashers and sputter etching systems. The kinetic energy of hyperthermal atomic beams can be has high as several hundred eV. Maintaining the high directionality of the hyperthermal beam requires a substantially collisionless environment with a total pressure of less than about 1 mTorr in the etching chamber.

Figure 14:
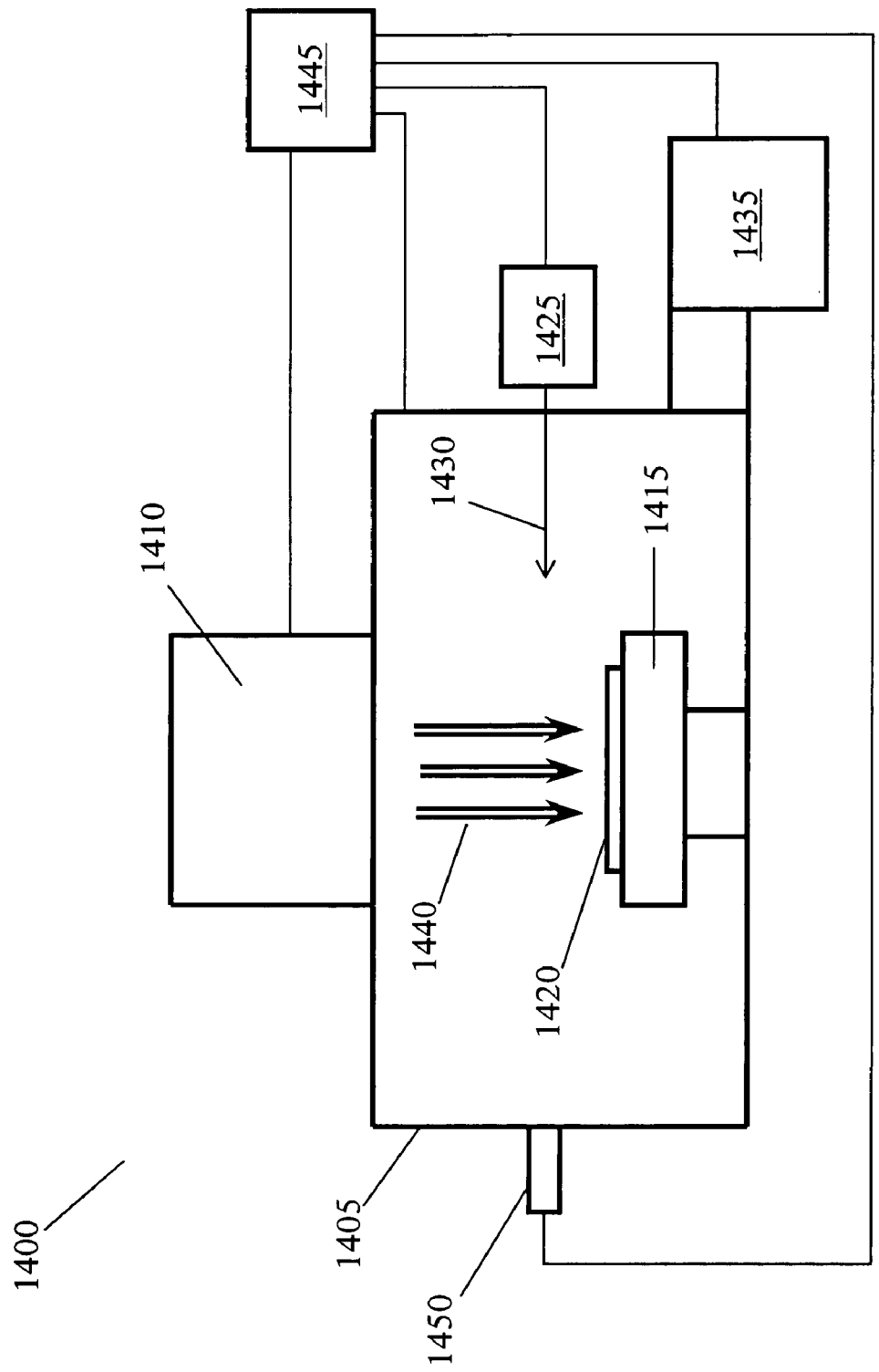
FIG. 14 shows a processing system according to an alternative embodiment of the invention.

FIG. 14 shows a processing system 1400 comprising a process chamber 1405 and a hyperthermal atom beam source 1410. The process chamber 1405 comprises a substrate holder 1415, upon which a substrate 1420 to be processed is affixed, a gas injection system 1425 for introducing process gas 1430 to the process chamber 1405, and a vacuum pumping system 1435. For example, a gate valve (not shown) is used to throttle the vacuum pumping system 1435. Process gas 1430 is introduced via the gas injection system 1425 and the process pressure is adjusted. The gas injection system 1425 allows independent control over the delivery of process gas 1430 to the process chamber from ex-situ gas sources. The process gas 1430 can comprise an etch reactant and inert gases. The etch reactant can comprise a β-diketone. The hyperthermal atom beam source 1410 generates a directional beam 1440 of high kinetic energy neutral atoms that can be introduced to the process chamber 1405 using a gate valve (not shown).

Substrate 1420 is transferred into and out of process chamber 1405 through a slot valve (not shown) and chamber feedthrough (not shown) via robotic substrate transfer system where it is received by substrate lift pins (not shown) housed within substrate holder 1415 and mechanically translated by devices housed therein. Once the substrate 1420 is received from the substrate transfer system, it is lowered to an upper surface of the substrate holder 1415.

In an alternate embodiment, the substrate 1420 is affixed to the substrate holder 1415 via an electrostatic clamp (not shown). Furthermore, the substrate holder 1415 further includes a temperature adjustment system including a re-circulating coolant flow that receives heat from the substrate holder 1415 and transfers heat to a heat exchanger system (not shown), or when heating, transfers heat from the heat exchanger system. As a result, the substrate temperature can be maintained at less than about 400° C. Alternatively, the substrate temperature can be maintained at less than about 200° C. Moreover, gas may be delivered to the backside of the substrate to improve the gas-gap thermal conductance between the substrate 1420 and the substrate holder 1415. Such a system is utilized when temperature control of the substrate is required at elevated or reduced temperatures. Vacuum pump system 1435 preferably includes aturbo-molecular vacuum pump (TMP) capable of a pumping speed up to 5000 liters per second (and greater) and a gate valve for throttling the chamber pressure.

A controller 1445 includes a microprocessor, a memory, and a digital I/O port capable of generating control voltages sufficient to communicate and activate inputs to the processing system 1400 as well as monitor outputs from the processing system 1400. Moreover, the controller 1445 is coupled to and exchanges information with the process chamber 1405, the hyperthermal atom beam source 1410, the process monitor system 1450, the gas injection system 1425 and the vacuum pump system 1435. A program stored in the memory is utilized to control the aforementioned components of a processing system 1100 according to a stored process recipe. One example of controller 1445 is a digital signal processor (DSP), model number TMS320, available from Texas Instruments, Dallas, Tex.

The process monitor system 1450 can comprise, for example, a mass spectrometer system to measure gaseous species, such as etch reactants and etch by-products in the processing environment. In general, the process monitor system 1450 is a versatile diagnostic tool capable of performing multiple tasks such as process analysis and endpoint detection. The process monitor system 1450 is shown in FIG. 14 is attached to the processing chamber 1405. In an alternate embodiment, some process monitor system components can be located downstream from the vacuum pump system 1435. The process monitor system 1450 can be used with controller 1445 to determine the status of the etching process and provide feedback to ensure process compliance.

Examples of hyperthermal atom sources will now be described. Various methods and systems have been developed for generating a beam of neutral hyperthermal atoms. The ionization of a supply gas can be carried out using optical laser-induced discharges, dc- or ac arcs, inductive coupling, microwave, or electron bombardment discharges, that are usually in a separate chamber connected to the wafer processing chamber. Ions that are formed in the plasma are accelerated to the selected high kinetic energy and then charge neutralized, forming a beam of neutral hyperthermal atoms. The charge neutralization of the ions can be carried out using a variety of different methods. An example is electron transfer from interaction of ions with metal surfaces at grazing incidence.

Chen and Yvonne in U.S. Pat. No. 6,331,701 entitled "RF-grounded sub-Debye neutralizer grid," describe a system for generating a hyperthermal beam of neutral O-atoms with kinetic energy ranging from 20 eV to 400 eV and a beam diameter of 1 inch to greater than 10 inches for processing large substrates. The hyperthermal beam is generated by passing accelerated oxygen ions from a RF-plasma through a neutralizer grid where the oxygen ions are charge neutralized through forward surface scattering. The hyperthermal beam has high flux of neutral O-atoms and a small divergent angle (~6-3°).

Optical laser-induced discharges can employ pulsed laser radiation as an energy source for dissociation the supply gas (e.g., $O_2$) in an expansion nozzle. The expansion creates a hyperthermal beam of neutral reactive species (e.g., O-atoms) that can be collimated using an orifice between the expansion chamber and the processing chamber.

In another embodiment of the invention, a processing system utilizes a process gas comprising an inert gas to modify a high-k dielectric layer by exposure to a plasma. The inert gas can be selected from a group of noble gases He, Ne, Ar, Kr, and Xe, or other gases (e.g. $N_2$) that are chemically non-reactive with a high-k layer in a plasma environment. The plasma species have sufficient energy to effectively disrupt and/or reduce the thickness of the high-k layer through interaction with the layer. Following the plasma treatment, the modified part (and possibly also the unmodified part) of the high-k layer is etched by a non-plasma process utilizing etch reactants that form volatile etch products when exposed to the modified high-k layer.

In an alternate embodiment of the invention, a processing system utilizes a process gas comprising a reactive gas to modify a high-k layer dielectric layer by exposure to a plasma. For example, the process gas can comprise reactive gases such as HBr or HCl, and an inert gas such as He. The plasma species have sufficient energy to effectively disrupt and/or reduce the thickness of the high-k layer through interaction with the layer. Following the plasma treatment, the modified part (and possibly also an unmodified part) of the high-k layer is etched by a non-plasma etch process utilizing a process gas comprising etch reactants that form volatile etch products when exposed to the modified high-k layer.

FIGS. 15A-15D show an exemplary cross-sectional representation of etching a high-k layer. In FIG. 15A, the segment 1500A comprises a high-k layer 1504 overlying a semiconductor substrate 1502 (e.g., Si). Surface modification of the high-k layer 1504 in FIG. 15A is carried out by exposing the high-k layer 1504 to a first process gas in a plasma, thereby forming a modified high-k layer 1506 shown as segment 1500B in FIG. 15B. Following the plasma treatment, the modified high-k layer 1506 can be substantially removed by a non-plasma etch process that exposes the modified layer 1506 to a second process gas comprising etch reactants. The etch reactants form volatile etch products when reacted with the modified high-k layer 1506. In segment 1500C (FIG. 15C), the modified layer 1506 has been removed by the etch process. If further removal (thinning) of the high-k layer 1504 is required, the process can be repeated until the desired thickness (or complete removal) of the high-k layer 1504 is achieved. Segment 1500D (FIG. 15D) shows complete removal of the high-k layer 1504.

In the case of very thin high-k layers (e.g., 50A or thinner), single plasma treatment can substantially modify the entire high-k layer, and subsequently, a single etch step can achieve complete removal of the high-k layer. For thicker high-k layers, a transitional region can exist between the modified high-k layer 1506 and the substantially unmodified layer 1504.

In a patterned etch process, where fine features are defined by a photoresist or a hard mask, the modification of the exposed high-k layer is substantially anisotropic due to ion bombardment that is parallel to the surface normal. As a result, the subsequent non-plasma etching of the modified high-k layer can be substantially anisotropic. In other words, the plasma modification process and the subsequent non-plasma etch process can result in anisotropic etching and removal of the exposed high-k layer in accordance with a mask pattern. The process gas and process conditions can be selected such that the patterned features and other materials are not significantly etched or damaged.

In the manufacturing of semiconductor devices, the removal of the high-k layer can be carried out at different stages during the patterning process. For example, the removal can be added to the end of a normal gate etch process recipe, or added to a standard spacer-etch process.

For example, a sequence for forming a gate electrode that is defined by a hard mask can comprise: 1) "break-through", that etches through the hard mask; 2) "main-etch", that forms the electrode features; and 3) "over-etch", that etches and removes the (high-k) dielectric layer overlying the Si substrate.

The above plasma etch step 3) can be accomplished by a plasma modifying/thinning process, followed by a non-plasma etch process. In the plasma process, the plasma species interact with and modify the high-k layer without completely removing it.

The exact effect of the plasma treatment on the high-k layer is currently not known. The plasma treatment may increase the amorphous content of the high-k layer and possibly breaks chemical bonds that create atomic fragments in the high-k layer. In addition to using inert gases, the disclosed plasma treatment can utilize reactive gases, where the ion energy is adequate to disrupt the atomic structure of the high-k layer in such a way that the subsequent non-plasma etch process is able to remove the modified high-k layer. When using reactive gases, the process conditions can be selected such that the existing gate-conductor features are not significantly etched. For example, the plasma energy can be varied to control the depth of the plasma interaction with the high-k layer.

Referring back to FIG. 2A, etching of the high-k layer according to an embodiment of the invention, results in the structure 100D shown in FIG. 2B, where the uncovered part of the high-k layer in FIG. 2A has been removed by exposing the high-k layer to a plasma modifying/thinning process, followed by exposing the modified high-k layer to an etch reactant. Referring back to FIG. 3A, complete removal of the high-k layer results in the structure 100F shown in FIG. 3B, where the uncovered part of the high-k layer has been removed by exposing the high-k layer to a plasma modifying/thinning process, followed by exposing the modified high-k layer to an etch reactant.

Figure 16:
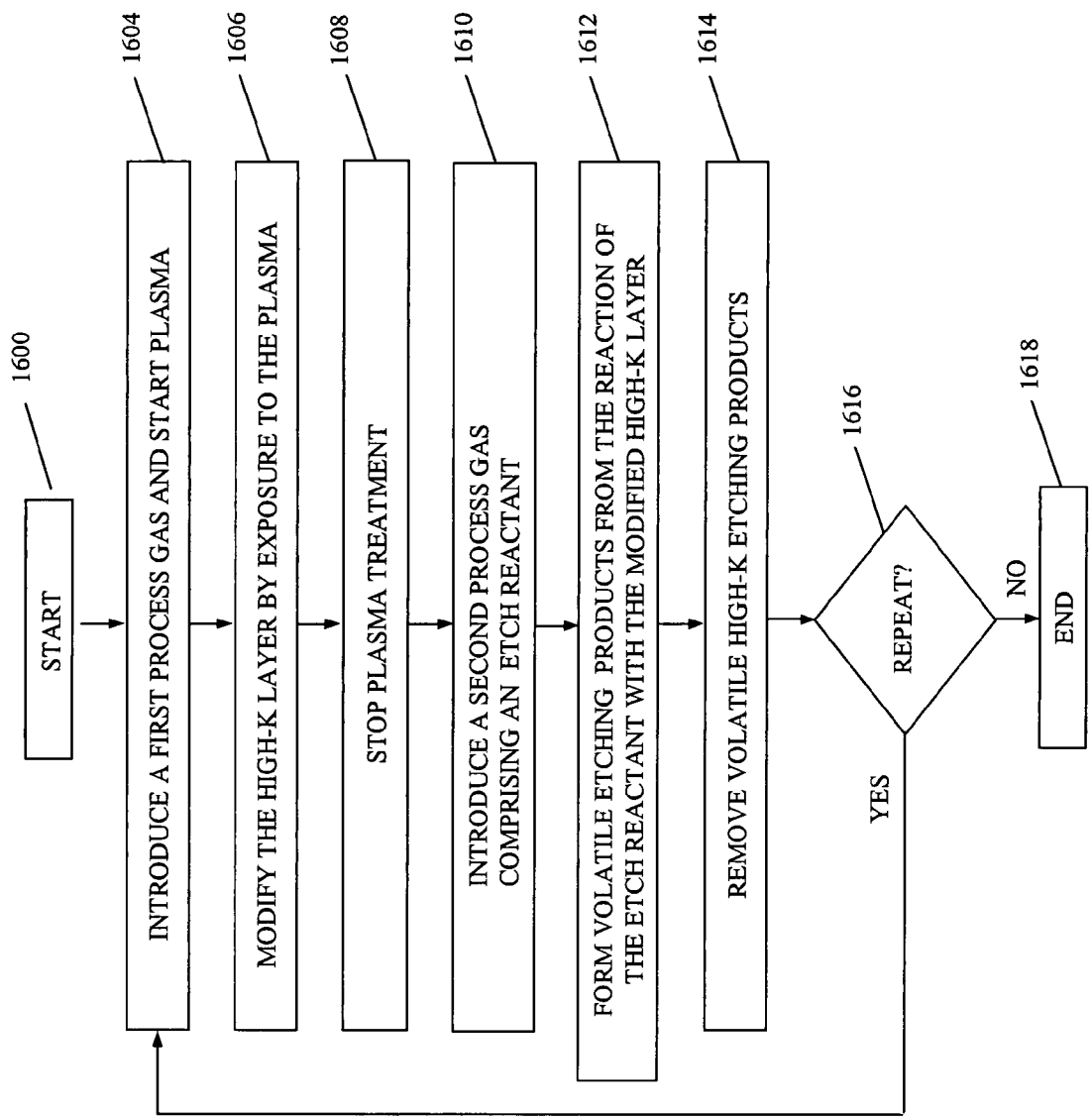
FIG. 16 is a flowchart for etching a high-k layer according to an alternative embodiment of the invention.

FIG. 16 is a flowchart for etching a high-k layer. At 1600, the process is started. A high-k layer can overlie another layer on a substrate, and the substrate can be positioned in a process chamber. At 1604, a process gas comprising an inert gas and/or a reactive gas, is introduced into the processing chamber, and a plasma is started. At 1606, the high-k layer is modified by exposure to the plasma. When the plasma process at 1606 has been carried out for an amount of time needed to modify the high-k layer, the plasma treatment is ended at 1608.

Following the plasma treatment at 1608, the modified high-k layer is further etched using in a non-plasma etch process utilizing a process gas that comprises an etch reactant. The etch process can be carried out in the same chamber as the plasma process, or in a second process chamber. During the etch process, the etch reactant is introduced into the process chamber at 1610. The etch reactant forms volatile etch products when reacting with the modified high-k layer at 1612, and the volatile etch products are removed by thermal desorption at 1614. Alternatively, the volatile etch products can be removed by a plasma-enhanced desorption process. If further removal of the high-k layer is required at 1616, the process can be repeated. When the desired removal of the high-k layer is achieved, the process ends at 1618.

Low selectivity of aggressive plasma processes with respect to etching of high-k dielectric layers overlying $SiO_2$, can be problematic when attempting to clear high-k layers overlying Si (and $SiO_2$) regions. Over-etching of high-k dielectric layers in the presence of a plasma can lead to excessive removal of Si from the isolation regions of a device. Therefore, integration of high-k dielectrics with Si gate electrode materials (and alternate gate electrode materials) requires the use of new etch processes with high selectivity to Si (and $SiO_2$). The suggested disruption of the molecular structure of the high-k layers during exposure to the plasma allows for a greater choice of etch reactants in the subsequent non-plasma etch process. These etch reactants can have high etch selectivity of high-k materials to Si (and $SiO_2$).

In one embodiment of the invention, a plasma modified high-k layer is etched by exposing the layer to a process gas comprising an etch reactant that readily reacts to form volatile etch products. The etch reactant can comprise a chemical compound, such as a β-diketone, that can react with the layer by chelating with the metal ions in the layer (i.e., the etch reactant attaches to a metal ion through more than one ligand atom), thereby forming etch products that allow complete (or partial) removal of the exposed layer. This reaction can result in relatively high etch rates for high-k layers and relatively slow etch rates for surrounding layers. Importantly, Si and $SiO_2$ layers are not known to form volatile etch products when reacted with etch reactants, such as β-diketones, thereby providing desired etch selectivity. An inert gas can be added to any one of the aforementioned process gas chemistries. The inert gas may include at least one of Ar, He, Ne, Kr, Xe, and $N_2$. In addition, an oxygen-containing gas (e.g., $O_2$, $H_2O$, $H_2O_2$) can be added to any one of the aforementioned process gas chemistries.

Process conditions that enable the desired etching of the high-k layer may be determined by direct experimentation and/or design of experiments (DOE). For example, adjustable process parameters can comprise substrate temperature, process pressure, choice of process gases and relative gas flows of the process gases. The process parameter space for the dry thermal etch process can, for example, utilize a chamber pressure less than 10 Torr, a process gas flow rate less than 2000 sccm, an etch reactant gas flow rate less than 1000 sccm (including a carrier gas), and a substrate temperature less than 400° C.

Figure 17:
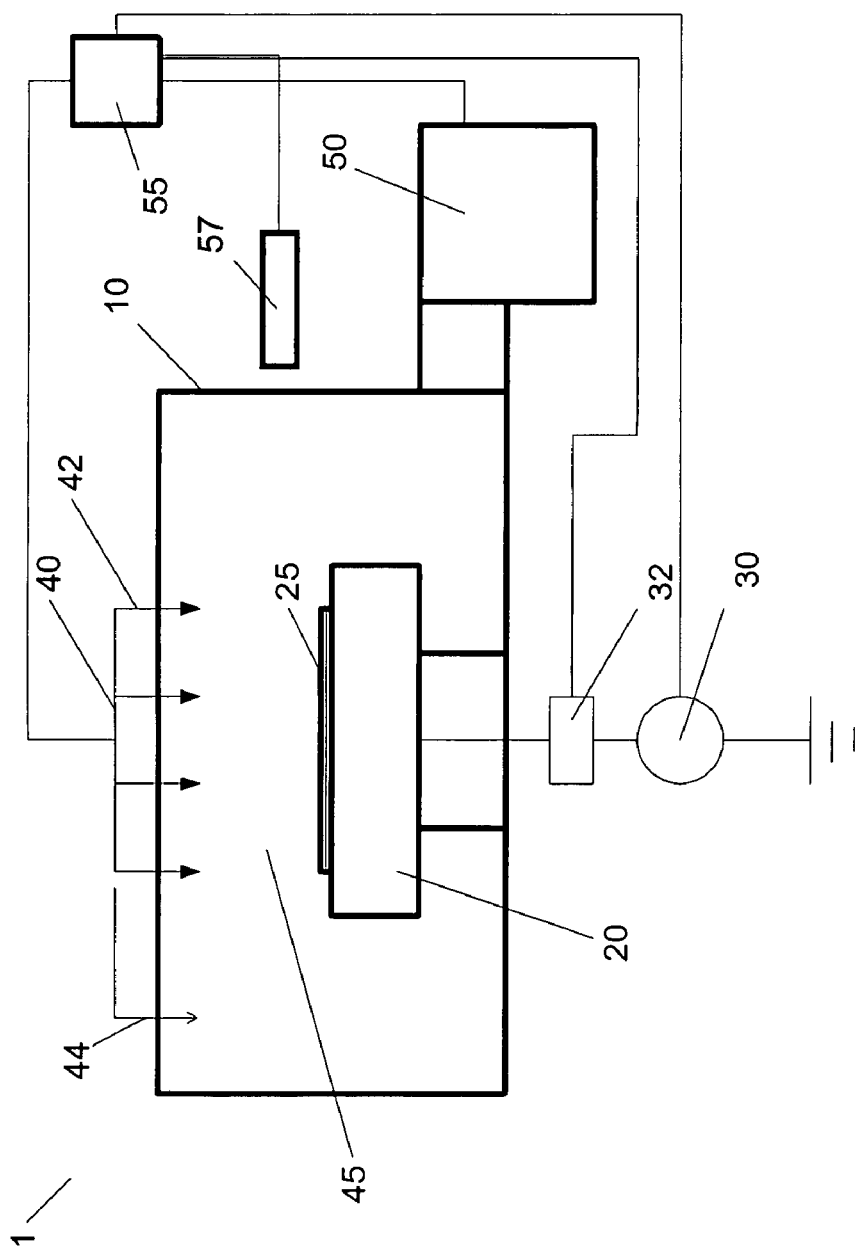
FIG. 17 shows a processing system according to another embodiment of the invention.

FIG. 17 shows a processing system according to one embodiment of the invention. In FIGS. 17-20, like reference numbers are used to indicate like elements. A processing system 1 that is capable of sustaining a plasma is depicted in FIG. 17, which includes a process chamber 10 configured to facilitate the generation of plasma in processing region 45. The processing system 1 further comprises a substrate holder 20, upon which a substrate 25 to be processed is affixed, and a gas injection system 40 for introducing process gases 42 to the plasma process chamber 10, and a vacuum pumping system 50. Alternately, gas injection system 40 can comprise an auxiliary gas dispenser 44 for introducing additional process gases, such as a carrier gas. The gas injection system 40 allows independent control over the delivery of process gases to the process chamber from ex-situ gas sources.

An ionizable gas or mixture of gases is introduced via the gas injection system 40 and the process pressure is adjusted. For example, controller 55 is used to control the vacuum pumping system 50 and gas injection system 40. Plasma is utilized to create materials specific to a predetermined materials process, and to aid either the deposition of material to a substrate 25 or the removal of material from the exposed surfaces of the substrate 25.

Substrate 25 is transferred into and out of chamber 10 through a slot valve (not shown) and chamber feed-through (not shown) via robotic substrate transfer system where it is received by substrate lift pins (not shown) housed within substrate holder 20 and mechanically translated by devices housed therein. Once the substrate 25 is received from the substrate transfer system, it is lowered to an upper surface of the substrate holder 20.

The substrate 25 can be affixed to the substrate holder 20 via an electrostatic clamp (not shown). Furthermore, the substrate holder 20 further includes a temperature adjustment system including a re-circulating coolant flow that receives heat from the substrate holder 20 and transfers heat to a heat exchanger system (not shown), or when heating, transfers heat from the heat exchanger system. As a result, the substrate temperature can be maintained at less than about 400° C. Alternatively, the substrate temperature can be maintained at less than about 200° C. Moreover, gas may be delivered to the backside of the substrate to improve the gas-gap thermal conductance between the substrate 25 and the substrate holder 20. Such a system is utilized when temperature control of the substrate is required at elevated or reduced temperatures. For example, temperature control of the substrate may be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermo-electric heaters/coolers are included.

In the embodiment, shown in FIG. 17, the substrate holder 20 can further serve as an electrode through which radio frequency (RF) power is coupled to plasma in the processing region 45. For example, the substrate holder 20 can be electrically biased at a RF voltage via the transmission of RF power from an RF generator 30 through an impedance match network 32 to the substrate holder 20. The RF bias serves to heat electrons and, thereby, form and maintain plasma. In this configuration, the system operates as a RIE reactor, wherein the chamber and upper gas injection electrode serve as ground surfaces. A typical frequency for the RF bias ranges from 1 MHz to 100 MHz and can be 13.56 MHz.

In an alternate embodiment, RF power can be applied to the substrate holder electrode at multiple frequencies. Furthermore, the impedance match network 32 serves to maximize the transfer of RF power to plasma in processing chamber 10 by minimizing the reflected power. Match network topologies (e.g., L-type, π-type, T-type) and automatic control methods are known in the art.

With continuing reference to FIG. 17, a process gas 42 is introduced to the processing region 45 through the gas injection system 40. Gas injection system 40 can include a showerhead, wherein the process gas 42 is supplied from a gas delivery system (not shown) to the processing region 45 through a gas injection plenum (not shown), a series of baffle plates (not shown) and a multi-orifice showerhead gas injection plate (not shown).

Vacuum pump system 50 can include a turbo-molecular vacuum pump (TMP) capable of a pumping speed up to 5000 liters per second (and greater), and a gate valve for throttling the chamber pressure. In conventional plasma processing devices utilized for dry plasma etch, a 1000 to 3000 liter per second TMP is employed. TMPs are useful for low pressure processing, typically less than 50 mTorr. For high pressure processing (i.e. greater than 100 mTorr), a mechanical booster pump and dry roughing pump are used.

A controller 55 includes a microprocessor, a memory, and a digital I/O port capable of generating control voltages sufficient to communicate and activate inputs to the processing system 1 as well as monitor outputs from the processing system 1. Moreover, the controller 55 is coupled to and exchanges information with the RF generator 30, the impedance match network 32, the gas injection system 40, process monitor system 57, and the vacuum pump system 50. For example, a program stored in the memory can be utilized to control the aforementioned components of a plasma processing system 1 according to a stored process recipe. One example of controller 55 is a digital signal processor (DSP); model number TMS320, available from Texas Instruments, Dallas, Tex.

The process monitor system 57 can comprise, for example, an optical emission spectroscopy (OES) system to measure excited particles in the plasma environment and/or a plasma diagnostic system, such as a Langmuir probe, for measuring plasma density. Alternately, process monitor system 57 can comprise a microwave and/or a RF diagnostic system. In addition to plasma diagnostic systems, the process monitor system 57 can comprise, for example, a gas analyzer such as a mass spectrometer system for monitoring gaseous etch reactants, etch products, and other gases in the processing environment. The process monitor system 57 shown in FIG. 17, is attached to the processing chamber 10. In an alternate embodiment, some process monitor system components can be located downstream from the vacuum pump system. The process monitor system 57 can be used with controller 55 to determine the status of the etching process and provide feedback to ensure process compliance.

Process conditions that enable the desired plasma modification of the high-k containing layer may be determined by direct experimentation and/or design of experiments (DOE). For example, adjustable process parameters can comprise plasma power, plasma frequencies, substrate temperature, process pressure, choice of process gases and relative gas flows of the process gases. Plasma power and plasma frequencies are process parameters that can be used to control the extent of dissociation of the process gas in the plasma, which in turn affect the efficiency of the modification process. In addition to the abovementioned process parameters, different methods for introducing process gases, such as the use of auxiliary gas dispenser 44, allow for additional control.

Figure 18:
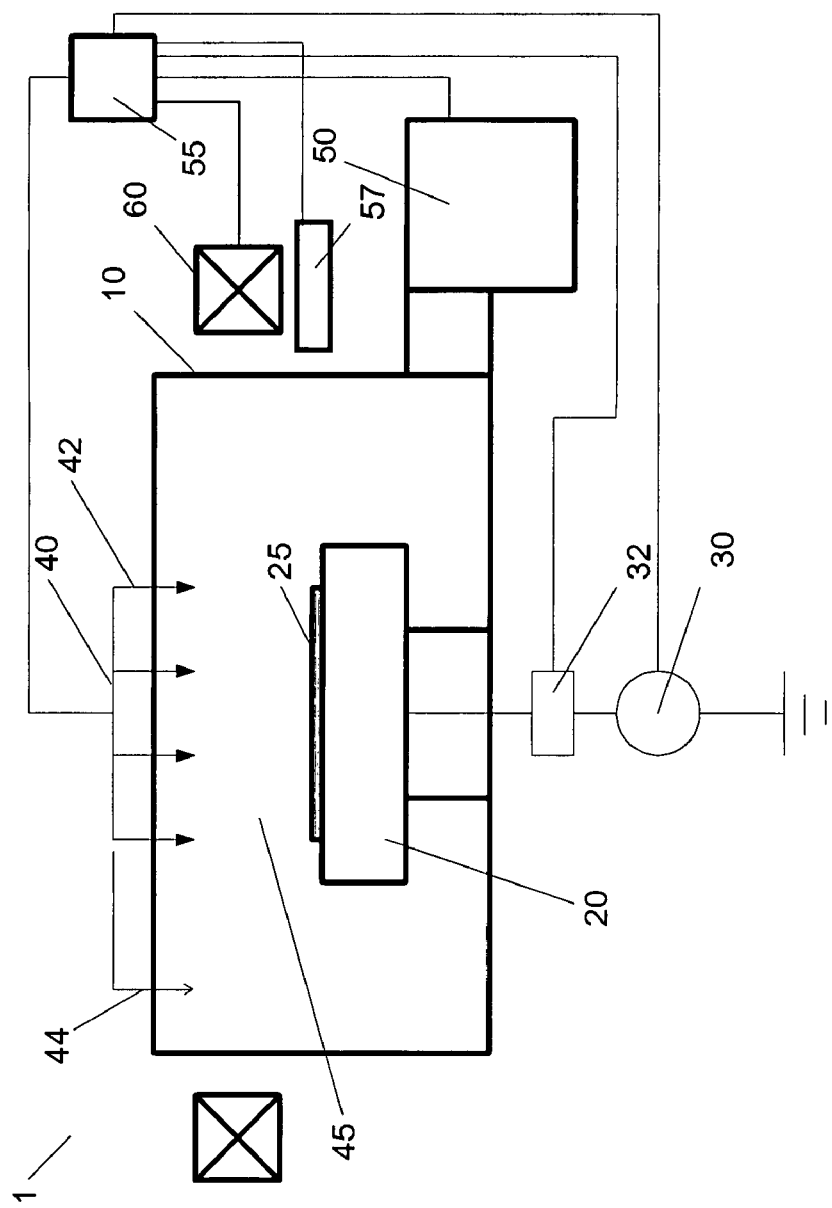
FIG. 18 shows a processing system according to an alternate embodiment of the invention.

FIG. 18 shows a processing system according to an alternate embodiment of the invention. The processing system 1 of FIG. 18 further includes either a mechanically or electrically rotating DC magnetic field system 60, in order to potentially increase plasma density and/or improve plasma processing uniformity, in addition to those components described with reference to FIG. 17. Moreover, the controller 55 is coupled to the rotating magnetic field system 60 in order to regulate the speed of rotation and field strength.

Figure 19:
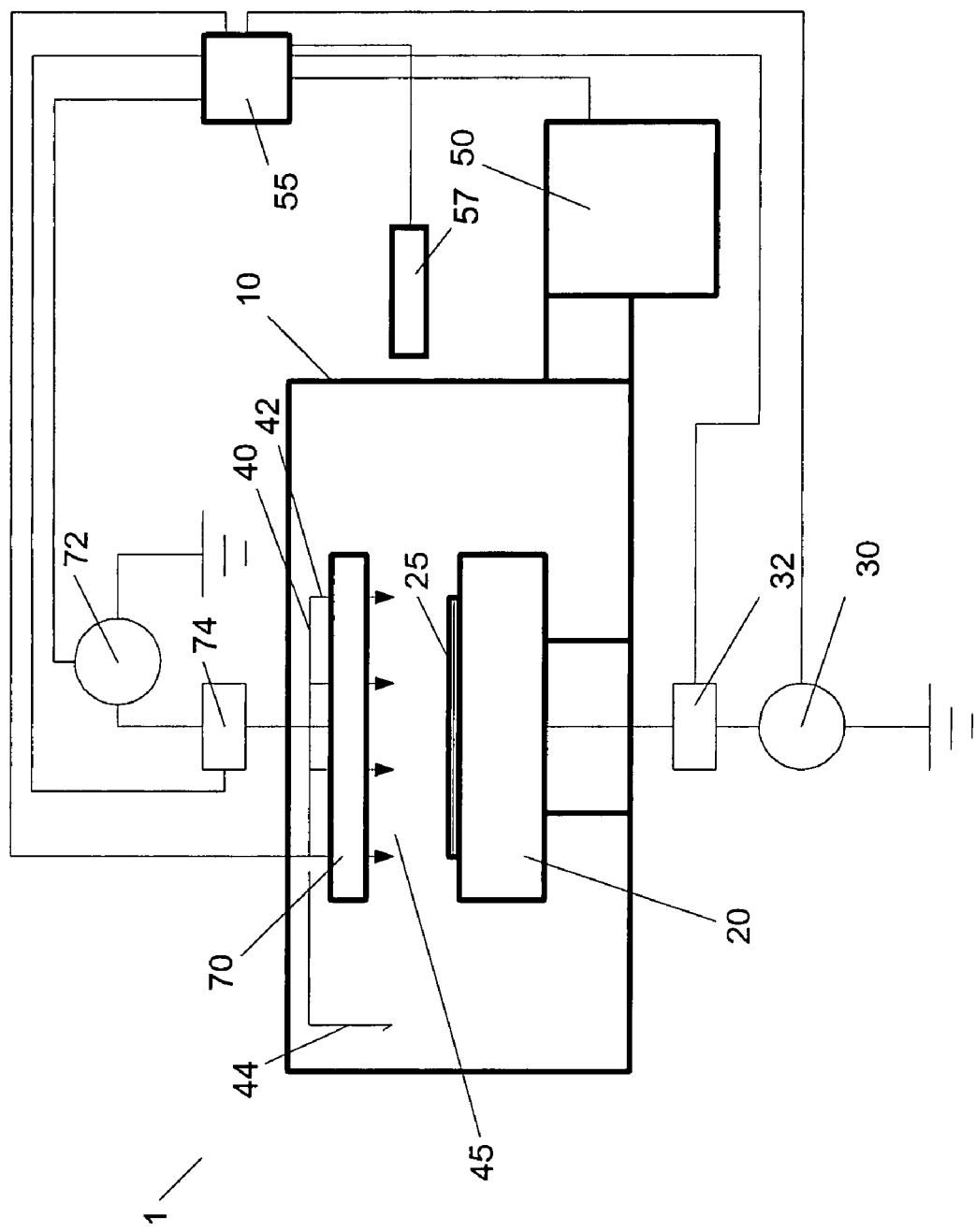
FIG. 19 shows a processing system according to an alternate embodiment of the invention.

FIG. 19 shows a plasma processing system according to an alternate embodiment of the invention. The processing system 1 of FIG. 19 further includes an upper plate electrode 70 to which RF power is coupled from an RF generator 72 through an impedance match network 74. A typical frequency for the application of RF power to the upper electrode ranges from 10 MHz to 200 MHz and is preferably 60 MHz. Additionally, a typical frequency for the application of power to the lower electrode ranges from 0.1 MHz to 30 MHz and is preferably 2 MHz. Moreover, the controller 55 is coupled to the RF generator 72 and the impedance match network 74 in order to control the application of RF power to the upper electrode 70.

Figure 20:
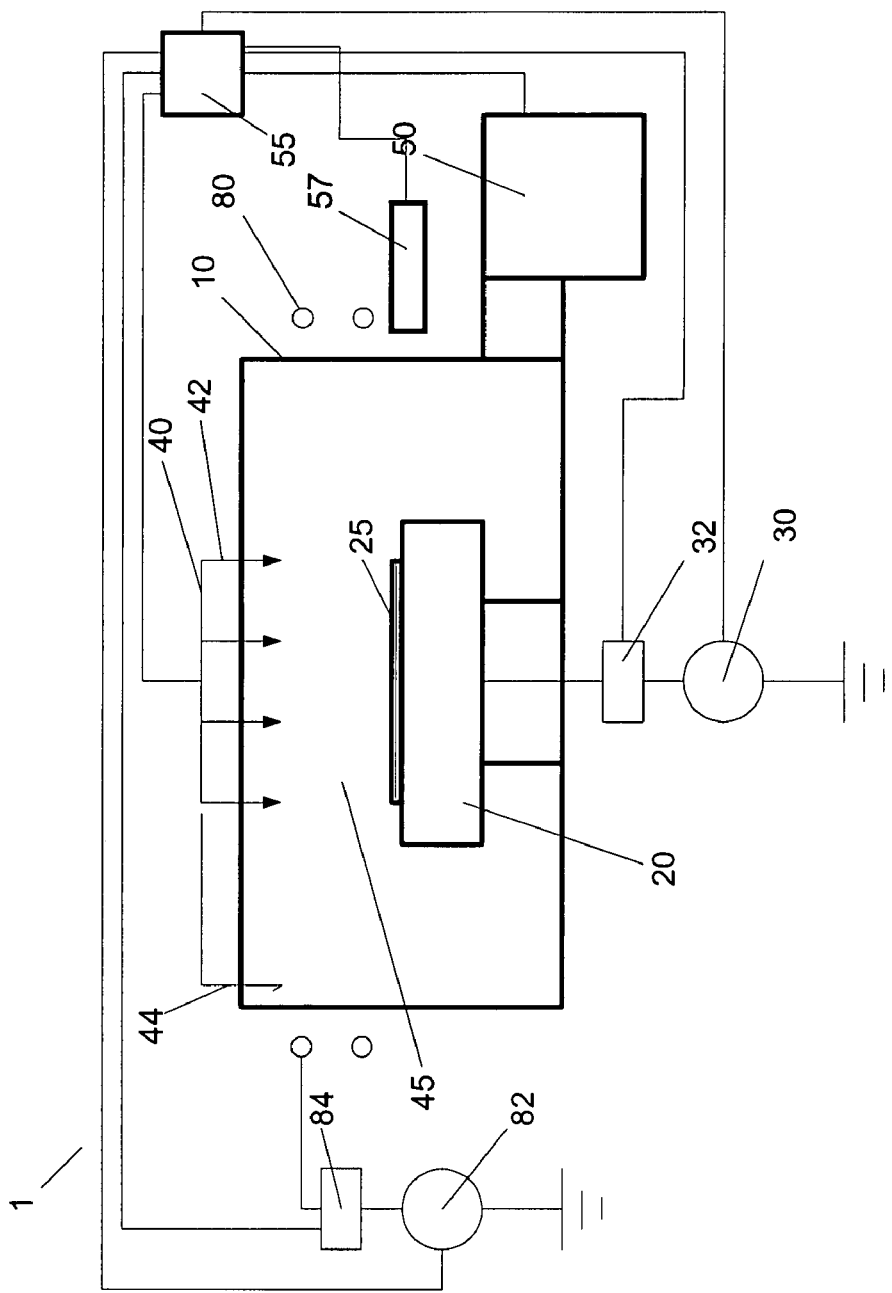
FIG. 20 shows a processing system according to an alternate embodiment of the invention.

FIG. 20 shows a processing system according to an alternate embodiment of the present invention. The processing system of FIG. 17 is modified to further include an inductive coil 80 to which RF power is coupled via an RF generator 82 through an impedance match network 84. RF power is inductively coupled from the inductive coil 80 through a dielectric window (not shown) to the processing region 45. A typical frequency for the application of RF power to the inductive coil 80 ranges from 10 MHz to 100 MHz and is preferably 13.56 MHz. Similarly, a typical frequency for the application of power to the chuck electrode ranges from 0.1 MHz to 30 MHz and is preferably 13.56 MHz. In addition, a slotted Faraday shield (not shown) can be employed to reduce capacitive coupling between the inductive coil 80 and plasma. Moreover, the controller 55 is coupled to the RF generator 82 and the impedance match network 84 in order to control the application of power to the inductive coil 80.

In an alternate embodiment, the plasma is formed using electron cyclotron resonance (ECR). In yet another embodiment, the plasma is formed from the launching of a Helicon wave. In yet another embodiment, the plasma is formed from a propagating surface wave.

Figure 21:
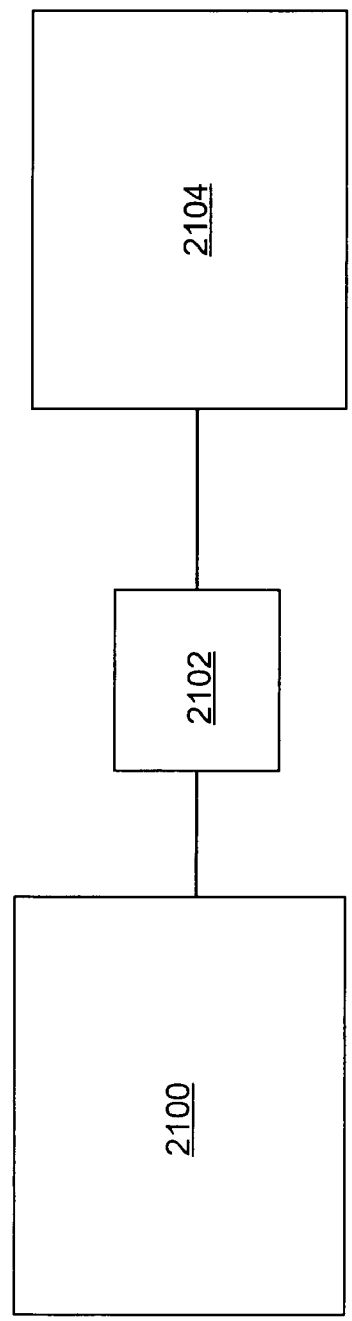
FIG. 21 shows a transfer system coupled to a plasma processing chamber and an etching chamber.

FIG. 21 shows a transfer system coupled to a plasma processing chamber and an etching chamber. Following the plasma process that modifies the high-k layer, the non-plasma etching of the layer can be performed in the same process chamber or in a separate etching chamber, either operatively coupled to or within processing chamber. In FIG. 21, the transfer system 2102 is operatively coupled to the plasma processing chamber 2100 and the etching chamber 2104. The transfer system can comprise a robotic substrate transfer system that mechanically translates substrates from the plasma processing chamber 2100 to the etching chamber 2104.

It should be understood that various modifications and variations of the present invention may be employed in practicing the invention. It is therefore to be understood that, within the scope of the appended claims, the invention may be practiced otherwise than as specifically described herein.

The invention claimed is:

1. A method for processing a layer containing a high-permittivity material, the method comprising:
    providing a substrate in a process chamber, the substrate containing the layer containing a high permittivity material comprising $HfO_2$;
    etching the layer containing a high-permittivity material by exposing the layer to a process gas comprising a β-diketone etch reactant while maintaining a pressure in the process chamber at less than about 10 Torr during the etching; and
    exposing the layer to a hyperthermal beam of neutral atoms.

2. The method according to claim 1, wherein the layer containing a high permittivity material overlies another layer on the substrate.

3. The method according to claim 1, wherein the β-diketone comprises at least one of acacH, tfacH, and hfacH.

4. The method according to claim 3, wherein the β-diketone includes hfacH.

5. The method according to claim 1, wherein the process gas further comprises an inert gas.

6. The method according to claim 5, wherein the inert gas comprises at least one of Ar, He, Ne, Kr, Xe, and $N_2$.

7. The method according to claim 1, wherein the process gas further comprises an oxygen-containing gas.

8. The method according to claim 7, wherein the oxygen-containing gas comprises at least one of $O_2$, $H_2O$, and $H_2O_2$.

9. The method according to claim 1, further comprising maintaining the substrate at a temperature of less than 400° C.

10. The method according to claim 1, further comprising maintaining the substrate at a temperature of less than 200° C.

11. The method according to claim 1, wherein the high-permittivity material further comprises at least one of $Ta_2O_5$, $TiO_2$, $ZrO_2$, $Al_2O_3$, and HfSiO.

12. The method according to claim 1, further comprising maintaining a flow rate of the process gas at less than 2000 sccm.

13. The method according to claim 1, wherein the process gas further comprises a carrier gas.

14. The method according to claim 13, wherein the carrier gas comprises an inert gas.

15. The method according to claim 14, wherein the inert gas comprises at least one of Ar, He, and $N_2$.

16. The method according to claim 13, further comprising maintaining a flow rate of the carrier gas at less than 1000 sccm.

17. The method according to claim 1, further comprising maintaining a flow rate of the β-diketone at less than 1000 sccm.

18. The method according to claim 1, wherein the hyperthermal beam of neutral atoms comprises at least one of He, At, O, and N.

19. The method according to claim 1, wherein the layer is at least initially exposed to the etch reactant before initiation of exposure to the hyperthermal beam of neutral atoms.

20. A method for processing a layer containing a high-permittivity material, the method comprising:
    providing a substrate in a process chamber, the substrate containing the layer containing the high permittivity material, wherein the high permittivity material comprises $HfO_2$ and at least one of $Ta_2O_2$, $TiO_2$, $ZrO_2$, $Al_2O_3$, and HfSiO;
    etching the layer containing a high-permittivity material by exposing the layer to a process gas comprising a β-diketone etch reactant and an oxygen-containing gas containing at least one of $O_2$, $H_2O$, and $H_2O_2$ while maintaining a pressure in the process chamber at less than about 10 Torr during the etching; and
    exposing the layer to a hyperthermal beam of neutral atoms.

21. The method according to claim 20, wherein the β-diketone comprises at least one of acacH, tfacH, and hfacH.

22. The method according to claim 20, wherein the hyperthermal beam of neutral atoms comprises at least one of He, At, O, and N.

23. The method according to claim 20, wherein the layer is at least initially exposed to the etch reactant before initiation of exposure to the hyperthermal beam of neutral atoms.

* * * * *